US012800396B2

(12) United States Patent
Ataei et al.

(10) Patent No.: US 12,800,396 B2
(45) Date of Patent: Nov. 17, 2026

(54) METHODS AND SYSTEMS FOR THERMAL IMAGE SENSING

(71) Applicant: OWL AUTONOMOUS IMAGING, INC., Fairport, NY (US)

(72) Inventors: Fatemeh Ataei, Victor, NY (US); Eugene M. Petillli, Victor, NY (US)

(73) Assignee: OWL AUTONOMOUS IMAGING, INC., Fairport, NY (US)

( * ) Notice: Subject to any disclaimer, the term of this patent is extended or adjusted under 35 U.S.C. 154(b) by 374 days.

(21) Appl. No.: 18/435,118

(22) Filed: Feb. 7, 2024

(65) Prior Publication Data

US 2024/0264003 A1 Aug. 8, 2024

Related U.S. Application Data

(60) Provisional application No. 63/443,951, filed on Feb. 7, 2023.

(51) Int. Cl.

| | |
|---|---|
| ***G01J 5/02*** | (2022.01) |
| ***G01J 5/00*** | (2022.01) |
| ***H03M 3/00*** | (2006.01) |

(52) U.S. Cl.

CPC ............... *G01J 5/026* (2013.01); *H03M 3/47* (2013.01); *H03M 3/49* (2013.01); *G01J 2005/0077* (2013.01)

(58) Field of Classification Search

CPC .... G01J 5/026; G01J 2005/0077; H03M 3/47; H03M 3/49

See application file for complete search history.

(56) References Cited

U.S. PATENT DOCUMENTS

| | | | |
|---|---|---|---|
| 5,598,157 | A | 1/1997 | Kornblum et al. |
| 6,111,529 | A | 8/2000 | Maulik et al. |
| 6,144,031 | A | 11/2000 | Herring et al. |
| 6,257,501 | B1 | 7/2001 | Wand et al. |
| 7,332,720 | B2 | 2/2008 | Minarik et al. |
| 8,067,735 | B2 | 11/2011 | King et al. |
| 10,819,919 | B2 | 10/2020 | Kuybeda et al. |

(Continued)

OTHER PUBLICATIONS

Kester, Walt, "ADC Architectures III: Sigma-Delta ADC Basics", Analog Devices, MT-022 Tutorial, Rev. A, 2011, 12 pgs.

(Continued)

*Primary Examiner* — John E Breene
*Assistant Examiner* — Janice M Soto
(74) *Attorney, Agent, or Firm* — LOZA & LOZA, LLP

(57) ABSTRACT

Methods and systems for thermal image sensing are disclosed. A method involves controlling a current ($I_{ACT}$) from a detector of a thermal image sensor with a first pulse width modulated (PWM) signal ($PWM_{ACT}$) for gain control, controlling a current ($I_{REF}$) from a reference source of the thermal image sensor with a second PWM signal ($PWM_{FEEDBACK}$) for gain control and for offset correction, wherein the second PWM signal ($PWM_{FEEDBACK}$) is generated in response to a digital output ($D_Q$) that is fed back from an analog to digital conversion circuit, and providing a current ($I_{SUM}$), which is the sum of the current ($I_{ACT}$) and the current ($I_{REF}$), to the analog to digital conversion circuit.

10 Claims, 15 Drawing Sheets

(56) References Cited

U.S. PATENT DOCUMENTS

| | | | | |
|---|---|---|---|---|
| 11,057,045 | B2 | 7/2021 | Averay | |
| 11,085,830 | B2 | 8/2021 | Aifer et al. | |
| 2004/0028243 | A1* | 2/2004 | Seo | H03M 1/662 381/111 |
| 2006/0170623 | A1 | 8/2006 | Naugler, Jr. et al. | |
| 2009/0121139 | A1* | 5/2009 | Chamming'S | H04N 25/671 250/340 |
| 2015/0226613 | A1 | 8/2015 | Bauer et al. | |
| 2018/0352174 | A1 | 12/2018 | Kuybeda et al. | |
| 2020/0344426 | A1* | 10/2020 | Petilli | G01J 5/0806 |
| 2020/0389606 | A1 | 12/2020 | Petilli et al. | |
| 2021/0190980 | A1 | 6/2021 | Stanchina | |

OTHER PUBLICATIONS

Budzier, Helmut, "Calibration of Infrared Cameras with Microbolometers", AMA Conferences 2015—Sensor 2015 and IRS2 2015, pp. 889-894.

Olbrycht, R. et al."New approach to thermal drift correction and gain determination in microbolometer thermal cameras", 2014, 6 pgs.

Orzanowski, Tomasz, "Nonuniformity correction algorithm with efficient pixel offset estimation for infrared focal plane arrays", SpringerPlus (2016) 5:1831, 8 pgs.

Tempelhahn, A. et al. "Shutter-less calibration of uncooled infrared cameras", J. Sens. Sens. Syst., 5, 9-16, (2016), pp. 9-16.

Yeo, Jun Dong et al. "Real-Time Non-Uniformity Correction without TEC for Microbolometer Array", Electronics 2022, 11, 3083, (2022), 12 pgs.

Yu, Le et al. "Low-Cost Microbolometer Type Infrared Detectors", Micromachines 2020, 11, 8, (2020), 19 pgs.

Posch, Christoph et al. "A QVGA 143 dB Dynamic Range Frame-Free PWM Image Sensor With Lossless Pixel-Level Video Compression and Time-Domain CDS", IEEE Journal of Solid-State Circuits, vol. 46, No. 1, Jan. 2011, pp. 259-275.

International Search Report and Written Opinion, PCT/US2024/014727, Apr. 17, 2024, 12 pgs.

* cited by examiner

| | Number Of Clocks | Ending Clock Cycle | Percent Base Ref |
|---|---|---|---|
| 1.2GHz PLL | 1 | 8.33E-10 | |
| Comparator | 10 | 10 | |
| Plus Tolerance | 4 | 14 | 13.11% |
| Base Pulse Width | 61 | 75 | |
| Minus Tolerance | 4 | 18 | -13.11% |
| Feedback -1/2 | -1 | 74 | -1.64% |
| Feedback 0 | 0 | 75 | 0.00% |
| Feedback 1 | 2 | 77 | 3.28% |
| Feedback 2 | 4 | 79 | 6.56% |
| Deadband | 1 | 80 | |
| PWM Freq | | 15,000,000 | Hz |

METHODS AND SYSTEMS FOR THERMAL IMAGE SENSING

CROSS-REFERENCE TO RELATED APPLICATIONS

This application is entitled to the benefit of U.S. Provisional Patent Application Ser. No. 63/443,951, filed on Feb. 7, 2023, which is incorporated by reference herein.

FIELD OF THE INVENTION

The present invention relates to methods and systems for analog to digital conversion for image sensing, such as thermal image sensing. The methods and systems have application to thermal detectors with high dynamic range requirements such as visible and infrared detectors found in focal plane arrays (FPAs) of thermal imaging systems.

BACKGROUND

Electrical signals generated by thermal image sensors such as those comprised of microbolometers often include variations in offsets from a reference level when no stimulus is present and in the signal amplitudes produced by identical stimuli at different times. These variations may be caused, for example, by changes in temperature, by sensor aging, or by non-linearity. In addition, the circuits used to convert the electrical signals into digital equivalents may also introduce variations in offset and gain. Such variations in offset and gain may result in digital values that do not accurately represent the characteristics of the stimuli, thereby causing inconsistencies in data from individual detectors and/or image sensors over time and mismatches in data from individual detectors and/or image sensors that are expected to provide uniform data from the same stimulus.

SUMMARY

Methods and systems for thermal image sensing are disclosed. A method involves controlling a current ($I_{ACT}$) from a detector of a thermal image sensor with a first pulse width modulated (PWM) signal ($PWM_{ACT}$) for gain control, controlling a current ($I_{REF}$) from a reference source of the thermal image sensor with a second PWM signal ($PWM_{FEEDBACK}$) for gain control and for offset correction, wherein the second PWM signal ($PWM_{FEEDBACK}$) is generated in response to a digital output ($D_Q$) that is fed back from an analog to digital conversion circuit, and providing a current ($I_{SUM}$), which is the sum of the current ($I_{ACT}$) and the current ($I_{REF}$), to the analog to digital conversion circuit.

In an example, the method involves controlling the current ($I_{ACT}$) from the detector involves making a gain adjustment to (the leading edge/trailing edge of the pulse) the first PWM signal ($PWM_{ACT}$), and controlling the current ($I_{REF}$) from the reference source involves making the gain adjustment and an offset adjustment to the second PWM signal ($PWM_{FEEDBACK}$).

In an example of the method, generating the second PWM signal ($PWM_{FEEDBACK}$) involves selecting a timing offset in response to the digital output ($D_Q$).

In an example of the method, generating the second PWM signal ($PWM_{FEEDBACK}$) involves selecting an offset ($T_O$) from a preconfigured set of offsets (e.g., $T_w$, $T_x$, $T_y$, $T_z$) in response to the digital output ($D_Q$).

Another method is disclosed. The method involves setting a pulse width of a pulse width modulated (PWM) signal ($PWM_{ACT}$) that is applied to a current ($I_{ACT}$) from a detector for gain control, adjusting a pulse width of a PWM signal ($PWM_{FEEDBACK}$) that is applied to a current ($I_{REF}$) from a reference source for gain control and offset correction in response to a digital feedback signal ($D_Q$) from an analog to digital conversion circuit, and providing a current ($I_{SUM}$) to the analog to digital conversion circuit, wherein the current ($I_{SUM}$) is the sum of the current ($I_{ACT}$) and the current ($I_{REF}$).

A system for analog to digital conversion for signals from a thermal image sensor is disclosed. The system includes an analog to digital conversion circuit, a summing node configured to provide a current ($I_{SUM}$) to the analog to digital conversion circuit for analog to digital conversion, means for controlling a current ($I_{ACT}$) from a detector of a thermal image sensor with a first pulse width modulated (PWM) signal ($PWM_{ACT}$) for gain control, and means for controlling a current ($I_{REF}$) from a reference source of the thermal image sensor with a second PWM signal ($PWM_{FEEDBACK}$) for gain control and offset correction, wherein the second PWM signal ($PWM_{FEEDBACK}$) is generated in response to a digital output ($D_Q$) that is fed back from the analog to digital conversion circuit, wherein the current ($I_{ACT}$) and the current ($I_{REF}$) are summed at the summing node to generate the current ($I_{SUM}$).

Another system for analog to digital conversion for signals from a thermal image sensor is disclosed. The system includes a delta sigma modulator (DSM) that generates a digital output ($D_Q$) in response to a current ($I_{SUM}$), a first switch that controls a current ($I_{ACT}$) from a detector of the thermal image sensor, wherein the first switch is controlled with a first pulse width modulated (PWM) signal ($PWM_{ACT}$) for gain control, a second switch that controls a current ($I_{REF}$) from a reference source of the thermal image sensor, wherein the second switch is controlled with a second PWM signal ($PWM_{FEEDBACK}$) for gain control and offset correction, a summing node configured to provide the current ($I_{SUM}$) to the DSM, wherein the current ($I_{SUM}$) is generated from the sum of the current ($I_{ACT}$) and the current ($I_{REF}$), and a multiplexer that receives the digital output ($D_Q$) of the DSM and outputs the second PWM signal ($PWM_{FEEDBACK}$) in response to the digital output ($D_Q$).

In an example of the system, the multiplexer selects a timing offset in response to the digital output ($D_Q$).

In an example of the system, the multiplexer selects an offset ($T_O$) from a preconfigured set of offsets (e.g., $T_{-1}$, $T_0$, $T_{+2}$, $T_{+4}$) in response to the digital output ($D_Q$).

In an example of the system, the multiplexer selects an offset ($T_O$) from a preconfigured set of offsets (e.g., $T_w$, $T_x$, $T_y$, $T_z$) in response to the digital output ($D_Q$).

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DESCRIPTION OF DISCLOSED EMBODIMENTS

Figure 1A:
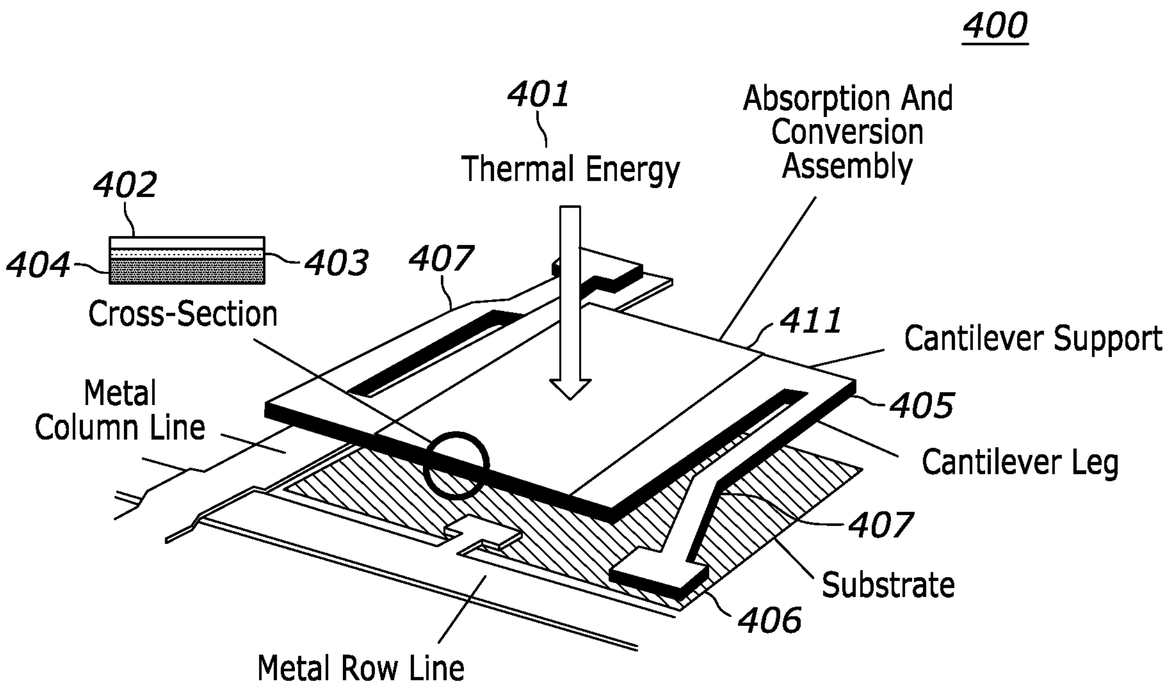
FIG. 1A is a drawing of a single microbolometer detector.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

A bolometer is a detector that measures the power of incident electromagnetic radiation by absorbing the radiation and measuring the change in temperature of the absorber using a material with a temperature dependent resistance. To take an image of an object radiating thermal energy, a two-dimensional array of small (typically 10 to 50 μm square) detectors (e.g., microbolometers) may be fabricated and placed behind a lens that transmits and focuses thermal energy, typically in the mid-wave infrared (MWIR) or long-wave infrared (LWIR) bands.

FIG. 1A shows the construction of a typical microbolometer 400. Incoming thermal energy 401 is absorbed by an absorption layer 402 (e.g., a top layer) having a low thermal mass. The absorption layer 402 is in thermal contact with a conversion layer 403 (e.g., an intermediate layer) that converts the temperature change in the conversion layer 403 caused by its close contact with the absorption layer 402 into a change in resistivity. The absorption layer 402 and the conversion layer 403 are mechanically supported by an insulating layer 404 (e.g., a thin insulating layer relative to the absorption layer and the conversion layer). In some microbolometers, the functions of the absorption layer 402 and the conversion layer 403 are performed by a single layer. A cantilever support 405 suspends an absorption and conversion assembly 411 (which includes the absorption layer 402, the conversion layer 403, and the insulating layer 404) away from a substrate 406 below to provide thermal isolation. Legs 407 of the cantilever support 405 are electrically conductive to provide an electrical connection between the absorption and conversion assembly 411 and circuitry in the substrate 406 to permit measurement of changes in resistivity.

Figure 1B:
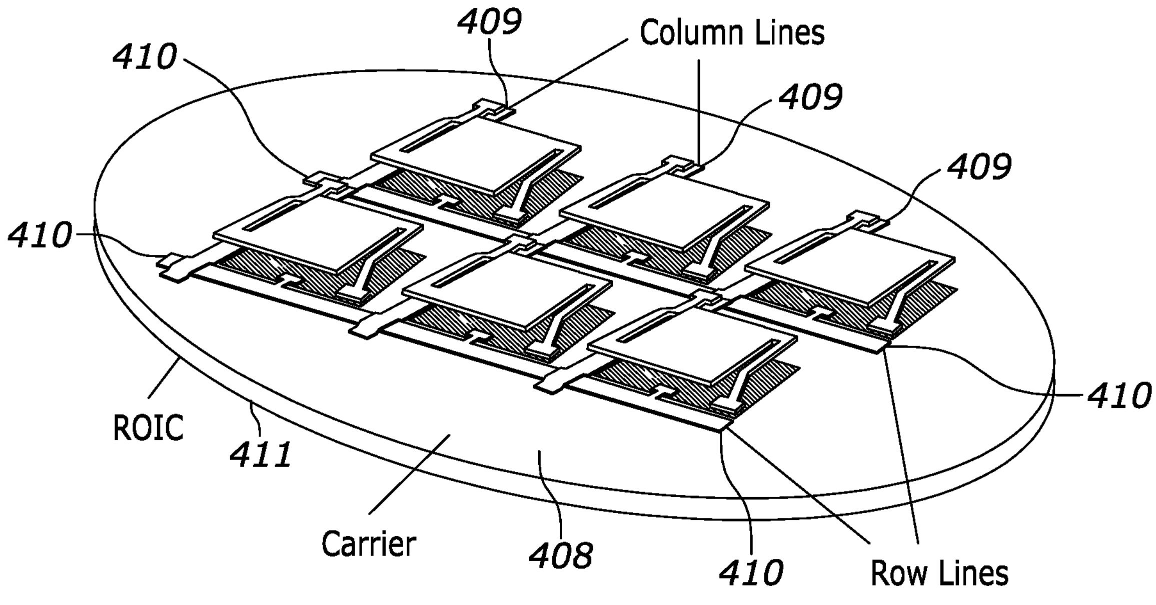
FIG. 1B is a drawing of an array of microbolometer detectors that form a portion of a thermal image sensor.

With reference to FIG. 1B, in an example thermal image sensor, detectors (e.g., microbolometers as described with reference to FIG. 1A) are produced in a two-dimensional array of, for example, 240×360 or 512×640 rows and columns of detectors on a silicon carrier wafer 408 (which may include the substrate 406, FIG. 1A). One leg of all of the detectors aligned in columns are connected together by column lines 409 and the other leg of all of the detectors aligned in rows are connected together by row lines 410. Typically, the row lines 410 are used to select a row of detectors to be read out and the column lines 409 carry the readout signals. These signals are routed to a second silicon wafer containing readout circuitry 411, for example, a readout integrated circuit (ROIC). Note: FIGS. 1A and 1B are not to scale. In an example, the center-to center separation distance of the detectors is in the range of 20 μm in both directions while the diameter of the wafers before they are cut into individual sensors is typically 200 mm. In most current cases, a wafer containing the detectors and a wafer containing ROICs are cut separately and the corresponding die are bonded together after cutting, with the detectors being bonded on top of the ROIC.

Early image sensors suitable for thermal imaging were cryogenically cooled, usually to either 77K, the temperature of liquid nitrogen, or 4K, the temperature of liquid helium. Such low temperatures were needed to reduce the dark current and random noise in the image sensors to levels low enough to allow reliable detection of the signal produced by incoming thermal energy.

Later, image sensors capable of operating in the range of 295K, nominally room temperature, were developed. The image sensors used various technologies including known microbolometer structures. To produce repeatable signals, microbolometers typically need some environmental control, such as stabilization of the operating temperature, shielding for unwanted thermal energy, and provision for periodic interruption of the incoming thermal image to allow for recalibration (e.g., a shutter or shuttering).

Photoconductive thin films change resistance in response to absorbed thermal energy. The magnitude of the incident infrared energy follows the resistive identity V=I*R. Photoconductive films include, but are not limited to, vanadium oxide (VOx), polysilicon, and carbon nanotubes. Photovoltaic infrared films behave like photodiodes and release electrical carriers in response to incident energy. Infrared responsive quantum dots (either photoconductive or photovoltaic) have been demonstrated as suitable thermal detectors using materials such as PbS, PbSe, HgTe, and $Ag_2Se$.

In some conventional photoconductive systems including microbolometers, in addition to the plurality of active bolometers (e.g., the pixels of a thermal image sensor array), the ROIC includes thermally shunted "reference" detectors, which are responsive to a temperature at the ROIC. For example, conventional systems typically connect either one reference bolometer and one active bolometer in series as a voltage divider or three reference bolometers and one active bolometer in a Wheatstone Bridge configuration with a differential voltage output.

Stray thermal energy can influence the temperature of an active bolometer, and thereby introduce non-signal dependent image noise. Stray "background" energy typically is introduced either by conduction to the substrate (e.g., the ROIC) or by radiation from the camera housing, thereby bypassing the optical lens subsystem. Such background energy can impact both the zero signal impedance (also referred to as the "offset") and the signal sensitivity (also referred to as the "gain") of a thermal energy detector such as a microbolometer.

The substrate temperature can be sensed using several approaches including a thermocouple, a semiconductor pn junction on the ROIC or "thermally shunted" bolometers on the ROIC. These approaches usually assume a known temperature gradient across the substrate (e.g., across the die of the ROIC). The ROIC temperature contribution to the active bolometer temperature can be used as a reference source to "auto zero" the measurement using analog or digital methods. Auto zero can be helpful to correct offsets due to changes in DC bias of the system but does little to correct the change in gain (e.g., the sensitivity) of the system based on the nominal operating temperature of an active bolometer.

Stray radiation from a camera housing is difficult to measure dynamically and the impact on a particular detector (e.g., a particular microbolometer or pixel of the image sensor) is difficult to predict given that distribution of the stray energy is far from uniform.

Electrical signals generated by thermal image sensors such as those comprised of microbolometers often include variations in offsets from a reference level when no stimulus is present and in the signal amplitudes produced by identical stimuli at different times. These variations may be caused, for example, by changes in temperature, by sensor aging, or by non-linearity. In addition, the circuits used to convert the electrical signals into digital equivalents may also introduce variations in offset and gain.

Such variations in offset and gain may result in digital values that do not accurately represent the characteristics of the stimuli, thereby causing inconsistencies in data from individual detectors and/or image sensors over time and mismatches in data from individual detectors and/or image sensors that are expected to provide uniform data from the same stimulus. It is therefore desirable to adjust the offset and gain of signals as part of the analog to digital conversion process so that the digital values more accurately represent the corresponding stimuli. Methods and system for providing such adjustments have been implemented in various ways.

In one conventional implementation, the offset of an analog signal is adjusted by the application of a voltage to one input of a differential amplifier while the signal to be adjusted is applied to the other input of the differential amplifier and the gain is adjusted by applying the signal to be adjusted to a gain-controlled amplifier while the gain control signal is applied to the control input. Such a technique for adjusting offset and gain requires amplifier designs that occupy a large amount of space in a silicon monolithic device and may be substantially unstable under wide variations in operating temperature.

In another implementation intended to avoid the problems in analog-domain adjustments, un-adjusted analog signals are converted to a digital form to which the adjustments are then applied using digital arithmetic. However, this technique requires the number of bits in the digitized signal to be substantially larger than the number of bits required in the adjusted signal. As an example, dealing with a junction temperature range spanning −40 C to 85 C and a detector signal of 8 to 12 bits would require an 18 to 21 bit ADC prior to adjustment. This requirement increases the area consumed in the silicon device and raises the power consumption.

It is understood by practitioners of the art that even if the analog signal is adjusted, errors may still be introduced during the conversion into digital values if the converter itself has unstable offset or gain.

Figure 2A:
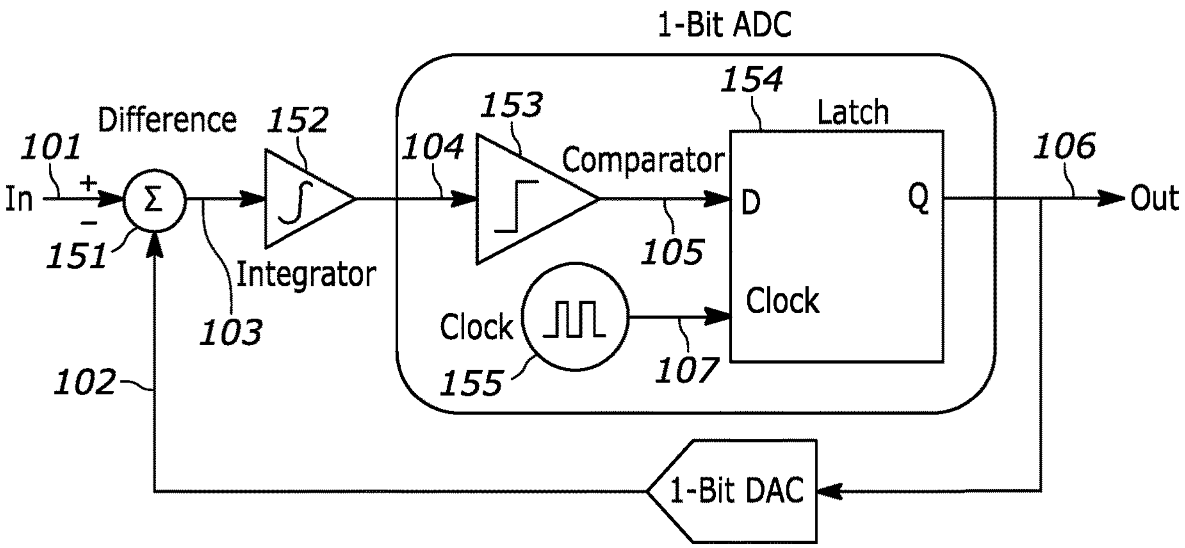
FIG. 2A is a block diagram of a conventional single-stage delta sigma modulator (DSM).

A delta sigma modulator (DSM) as shown in FIG. 2A is a circuit that converts an incoming analog signal 101 into a digital equivalent through a constant comparison in a summing node 151 between the incoming analog signal (e.g., supplied to the positive input of the summing node) and a reference signal 102 (e.g., supplied to the negative input of the summing node). The reference signal 102 generated from the output 105 of a comparator 153 synchronized with a timing signal 107 produced by a clock 155 in a latch 154 that switches between a low level and a high level depending on whether the output of an integrator circuit 152, which integrates the incoming signal, is above or below a voltage set in the comparator 153 (e.g., zero Volts), to produce a digital output 106. The time it takes for the integrator circuit 152 to produce a crossover at the comparator 153 depends, in the general case, only on the integrated amplitude 104 of the signal 103 that is output from the summing node 151.

Figure 2B:
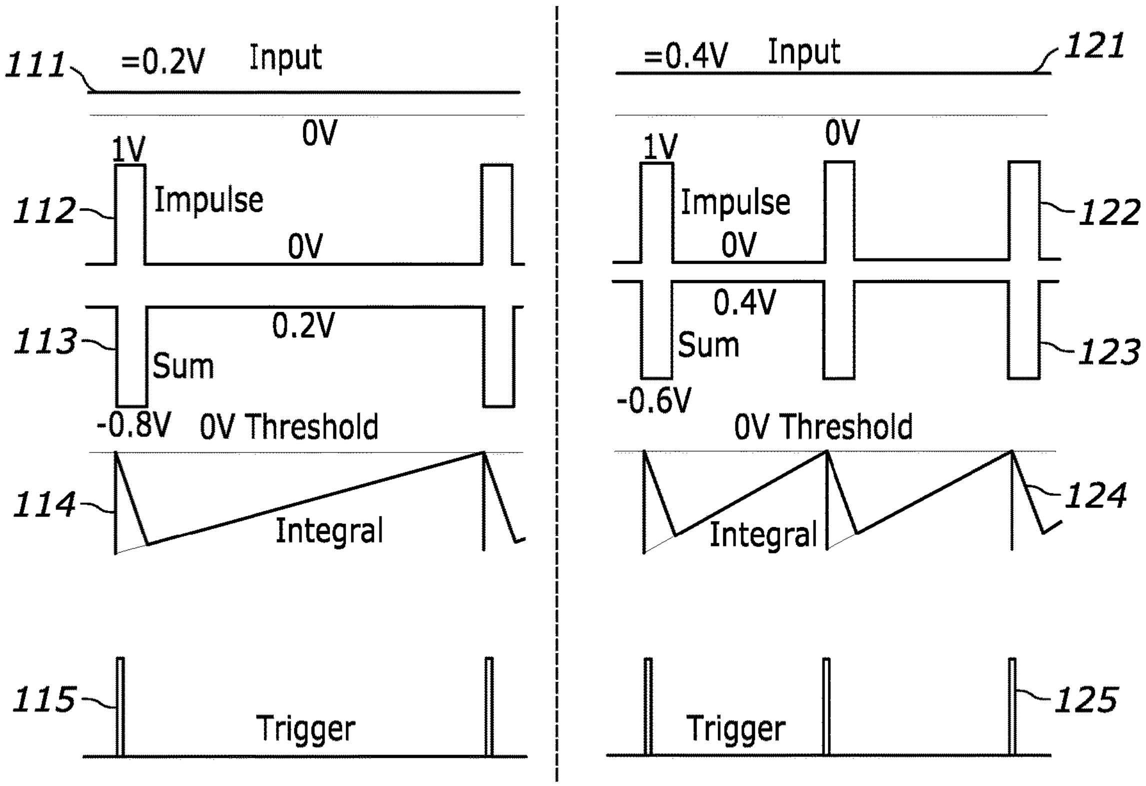
FIG. 2B is a set of waveforms that characterize the operation of the DSM of FIG. 2A.

Example waveforms produced by the DSM of FIG. 2A are shown in FIG. 2B. In a typical implementation, the input signal 111 at the positive input of the summing node 151 might be, for instance, 0.2 Volts DC. Based on the result of a previous integration, the comparator 153 produces a pulse 112 that is applied to the negative input of the summing node 151 through the feedback loop and reference signal 102. The arithmetic sum of the two signals, which is output from the summing node 151, is a signal 113 that has a large negative pulse portion which rapidly resets the integrator circuit 152 to a reference value. The signal 113 passes from the summing node 151 to be integrated by the integrator circuit 152 until the value of the integration 114 passes the comparator threshold (e.g., zero Volts) of the comparator 153, which causes the comparator 153 to generate a trigger pulse 115, which restarts the integration again.

Figure 2C:
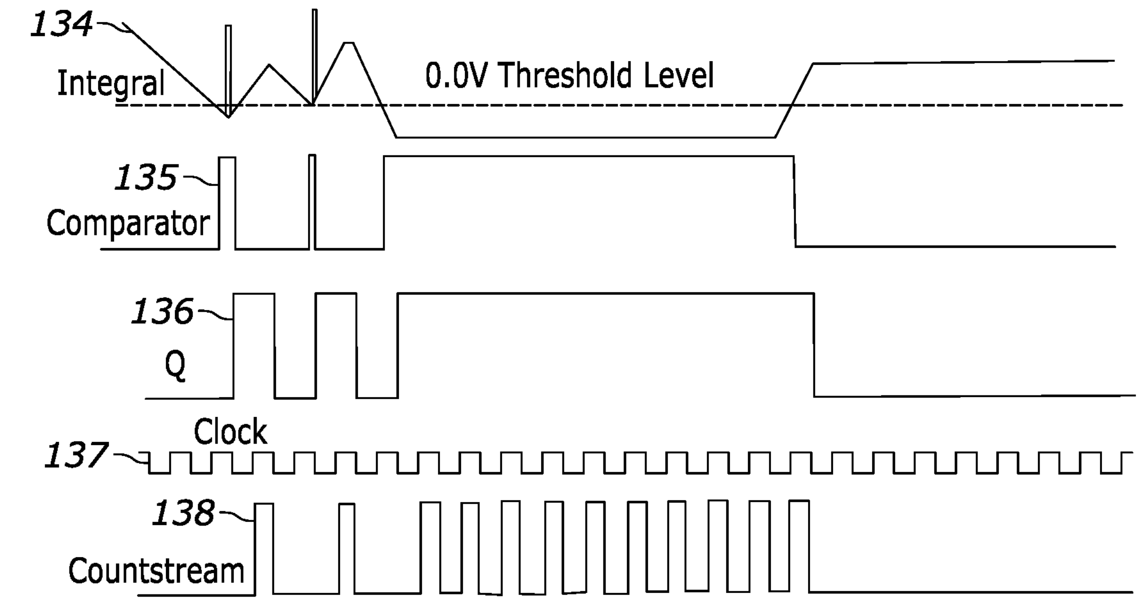
FIG. 2C is a set of waveforms showing the operation of the DSM of FIG. 2A under a varying input signal.

The length of the integration period is determined by the amplitude of the input signal 111. In the waveforms 121 through 125, it can be seen that doubling the amplitude of the input signal 121 to 0.4 Volts DC reduces the time period for the integration 124 to reach the comparator threshold (e.g., zero Volts) by one-half. In general, the input signal (e.g., 101, 111, 121) is constantly changing and the integration value (e.g., 104, 114, 124) represents the sum of all of these variations in the input signal. Such a signal 134 is shown in FIG. 2C with matching changes in the period between comparator output pulses 135. Following the comparator 153, the comparator transitions 136 are latched synchronously with the clock 137 and then the latched signal is used to pass clock pulses 138 that are counted to produce a multibit digital output value.

However, as can be seen in FIG. 2A, the integrated amplitude 104 of the incoming signal 103 can also be affected by changing the level of the signal at the negative input of the summing node 151, that is, by changing the level of the reference signal 102 that is fed back from the comparator 153.

Such conventional techniques use a feedback loop in a delta sigma modulator (DSM) to provide corrections during the DSM digitizing process. However, these methods may themselves introduce variations resulting from changes in temperature since they rely on analog circuitry to control the amount of adjustment that is applied.

A novel readout circuit is disclosed herein, which includes digitally adjustable offset and gain, enabling dynamic optimization of the circuit used to convert analog signals generated from a detector into digital equivalents. Traditionally, offset and gain adjustments would be applied digitally after the analog to digital conversion, which places additional resolution and dynamic range (DR) requirements on the ADC. In an embodiment, a DSM is operated in an oversampled mode so that the oversampled digital output of the DSM may be processed by a digital decimation filter followed by an accumulator. When the entire analog to digital converter (ADC) (e.g., DSM plus decimation/accumulation) is connected directly to thermal detectors of the image sensor, the ADC adjusts for numerous analog noise sources by replacing the noise sources with digital signals, which improves image quality of a digital focal plane array (DFPA). In an embodiment of a DFPA, each accumulator replaces the traditional integration capacitor and serves as one location in a digital frame storage array.

A modern mid-wave infrared (MWIR—3 μm to 5 μm wavelength) or long-wave infrared (LWIR—8 μm to 14 μm wavelength) thermal image sensor (e.g., a DFPA) might have a million microbolometers, commonly fabricated from either amorphous silicon (aSi) or vanadium oxide (VOx). By locating the corresponding ADCs and resulting frame store directly below the active imaging area, total die size is greatly reduced when compared to conventional focal plane arrays (FPAs) with column-based ADC readout. The resulting high definition (HD) DFPA die area is only about 20% larger than state-of-the-art lower resolution video graphics array (VGA) thermal FPAs having the same 12 μm pixel pitch, which enables low-cost wafer level vacuum packaging of HD thermal imagers.

VOx microbolometers can be fabricated on a silicon wafer directly above the ADCs using, for example, a 3D micro-electro-mechanical systems (MEMS) process. Microbolometers are sensitive to conducted thermal noise from the die below so by constructing the majority of the pixel element (e.g., where a pixel element includes a detector (e.g., a microbolometer) and a readout circuit) in the low voltage digital domain of a DSM, the power consumption and resulting thermal noise can be greatly reduced, further improving noise equivalent delta temperature (NEDT).

In an embodiment, the active imaging area of an image sensor is arranged hierarchically into tiles of 16×16 pixels to aid in reusability and layout. Each tile includes trunk buffers to pass digital signals to adjacent tiles as well as utilizing a leaf architecture clock tree distribution method for the tiles. This enables arbitrarily sized DFPAs to be developed by appropriate arraying of correct-by-construction tiles. The architecture permits replacement of a traditional analog column multiplexer by a hierarchical digital multiplexer, eliminating readout crosstalk.

Figure 3:
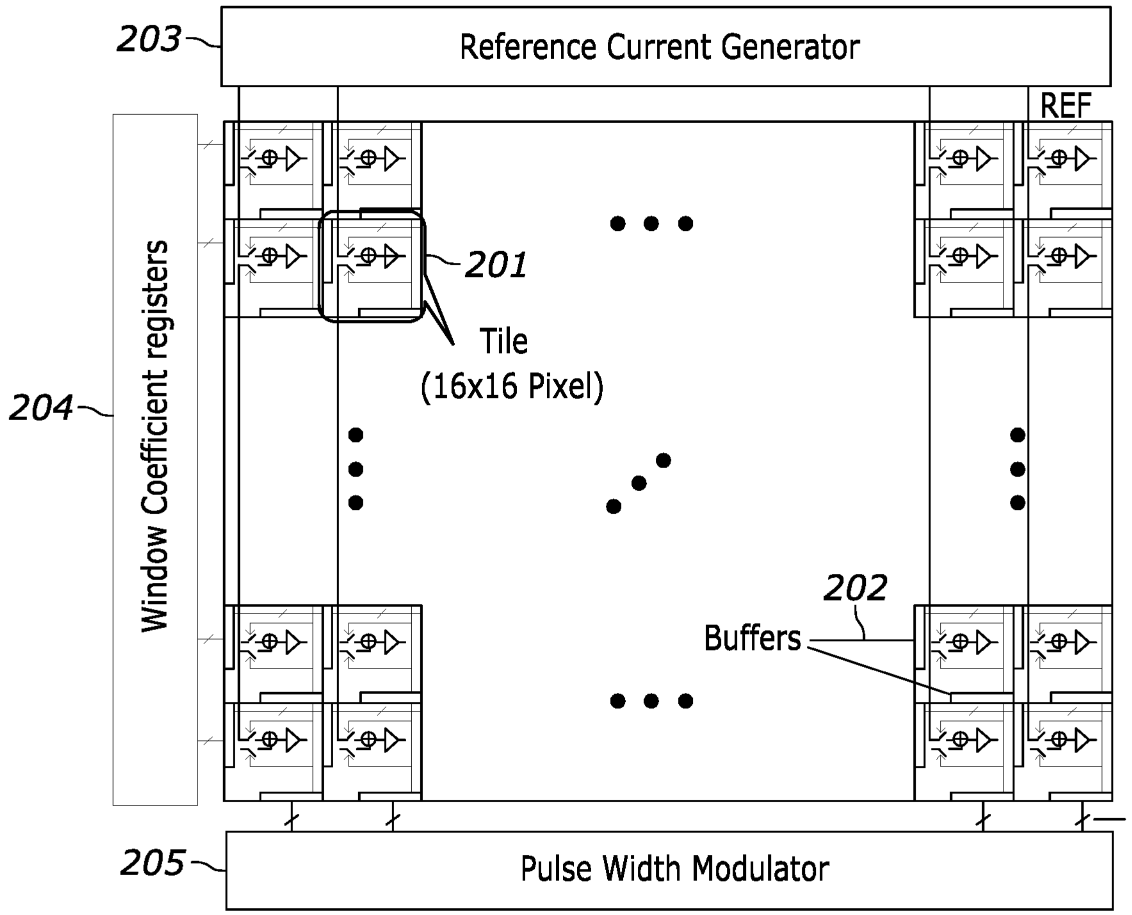
FIG. 3 is a block diagram of a readout integrated circuit (ROIC) that includes an array of tiles in which each tile corresponds to an array of thermal detectors.

FIG. 3 is a block diagram of an example of a readout integrated circuit (ROIC) that includes an array of tiles in which each tile corresponds to an array of thermal detectors. FIG. 3 depicts an array of tiles 201 and surrounding circuitry that includes a reference current generator 203, window coefficient registers 204, and a pulse width modulator 205. A single tile 201 in the array has, for example, an array of readout circuits and each tile in the array corresponds to array of detectors (not shown), such a 16×16 array of detectors for each tile, with each detector being built on a substrate below, where the readout circuits are located, e.g., being built on top of the ROIC. In the embodiment of FIG. 3, each tile includes buffers 202 for control signals (e.g., the detectors reset and clock. The reference current generator 203 provides the control current for the readout amplifiers (see FIG. 6B, $I_{REF}$ 623). Settings for the final filtering of the digital output (e.g., window coefficients) are stored in the window coefficient registers 204. Clock signals (including PWM signals as described herein) for the tiles are generated by the pulse width modulator 205.

DSMs are noise-shaping, closed loop data converters in which a low-noise capacitive transimpedance amplifier (CTIA) is used as the first error integrating stage. A CTIA integrator is inherently more sensitive than a direct injection input stage. The feedback from the DSM digital output is converted to a current signal using a current-measuring digital to analog converter (IDAC), which is then subtracted from the detector's current at the CTIA input (e.g., via current summing at a summing node). The DSM then integrates the instantaneous error between the detector input and the IDAC output.

Since only the instantaneous error is integrated, not the full signal dynamic range, gain can be applied earlier in the conversion process. DR and SNR are thus limited only by the decimation (e.g., 17 bits deep), not by an analog sample and hold capacitor charge storage capacity. In an embodiment, a DFPA uses per-column reference detectors (e.g., per-column reference bolometers) as a reference source to derive the reference current for the feedback IDAC. By varying the relative charge summed from the DSM output verses input charge from the active bolometer, the conversion offset and gain can be optimized to fit the dynamic range of the ADC. In an embodiment, digitally controlled offset and gain parameters (e.g., $T_O$ and $T_B$ in FIG. 5B) are implemented independently for each tile, e.g., to account for manufacturing variations.

Techniques disclosed herein can improve the Signal-to-Noise Ratio (SNR) of an ADC by correcting/adjusting both the offset and gain of the conversion process so the ADC has a better match between the input signal dynamic range and the dynamic range of the ADC regardless of the type of detector that is used. In the various embodiments disclosed herein, a detector can be fabricated using photoconductive (e.g., microbolometer) or photovoltaic (e.g., Photodiode, nBn, colloidal quantum dot (CQD)) materials.

When used in a thermal imaging system, the impact of noise from the detector thermal operating point and from non-imaged thermal sources can be mitigated by the techniques disclosed herein. Two thermal noise sources considered herein are direct thermal radiation from a camera housing to the detector and thermal conduction to the detector from a ROIC.

Additionally, undesired thermal energy arriving from regions viewable by the camera lens and imaged outside the image sensor active area can be blocked by a “cold shield,” which has an aperture to allow focused energy to reach only the image sensor active area. A thermoelectric cooler (TEC) or Peltier cooler can be used to reduce the temperature of the cold shield to be below the ambient temperature of the housing.

In one embodiment, both the cold shield and the ROIC are coupled to the same TEC and held at predominantly the same temperature. In at least one embodiment, the aperture in the cold shield acts as the optical aperture of the system and additionally serves as a cold stop, setting the F # of the lens. The outer camera housing plus cold shield are configured similar to a double wall thermos and may additionally have insulation or a vacuum to increase the thermal resistance to the external environment.

The undesired conducted thermal energy reaching individual detectors of an image sensor of a thermal imaging system is mitigated by adjustment of the offset and gain of detector signals as part of the digitization by the ADC. The contribution of the ROIC conductive energy (noise) can be several orders of magnitude larger than the desired signal energy, changing both the offset and gain of the resulting digital signal. In some conventional thermal imaging systems, the offset and gain are typically adjusted using digital processing after the ADC. Correction after digitization places large DR and SNR requirements on the ADC. Implementing digital correction for a ROIC junction temperature range spanning −40 C to 85 C and a detector signal of 8 to 12 bits would likely require an 18 to 22 bit ADC prior to digital correction.

In an embodiment in accordance with the invention, an active detector signal originating in a microbolometer in response to infrared thermal energy is pulsed onto the current input of a capacitive transimpedance amplifier (CTIA), which serves as the first stage of a second order delta sigma modulator (DSM) ADC. The over-sampled output of the DSM is a 4-level (2-bit) noise shaped digital signal (although digital signals that convey more or less than 4 levels are possible). DSMs are closed loop data converters. To close the loop, the digital output is fed back to the analog current-differencing CTIA input via a pulse width modulated (PWM) configuration current digital to analog converter (IDAC). In an embodiment, the reference current for the IDAC is proportional to the current through a thermally shunted reference bolometer (e.g., $I_{REF}$), which is proportional to the junction temperature on the readout integrated circuit (ROIC). The difference in currents between the current from the active detector and the current from the reference detector is integrated by the CTIA and converted to a voltage that is proportional to the desired signal level and that is noise shaped by the noise transfer function (NTF) of the DSM.

Figure 4A:
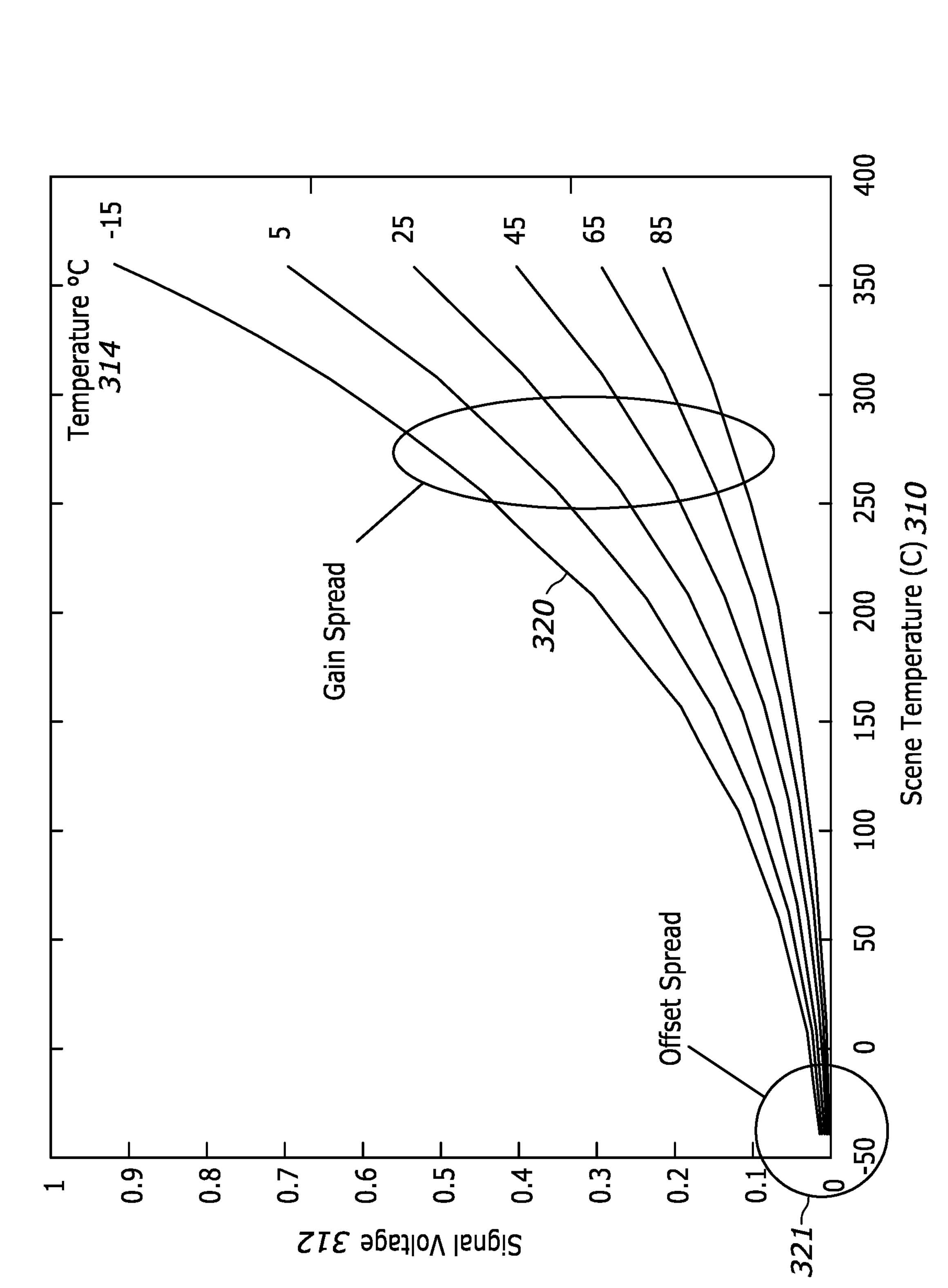
FIG. 4A is a graph of uncorrected signals from an individual detector at various temperatures and signal levels.

Referring to FIG. 4A, an active pixel scene temperature 310 is shown on the X axis and an analog voltage representation of a signal is shown on the Y axis 312. Each member of the family of curves is produced at one of the indicated ROIC die temperatures 314. The basic shape of the curves 320 is consistent but the signals at the lowest temperature 321 are offset for the various curves 320 and the maximum signal is dominated by the ROIC die temperature. The required sensitivity for forming images at low scene temperatures necessitates small ADC quantization step sizes (e.g., high signal gain) but the maximum output signal from high junction temperatures necessitates extended dynamic range or large ADC quantization steps. It is beneficial, therefore, to minimize the required dynamic range by producing the same curve at all ROIC die temperatures before digitizing.

Figure 4B:
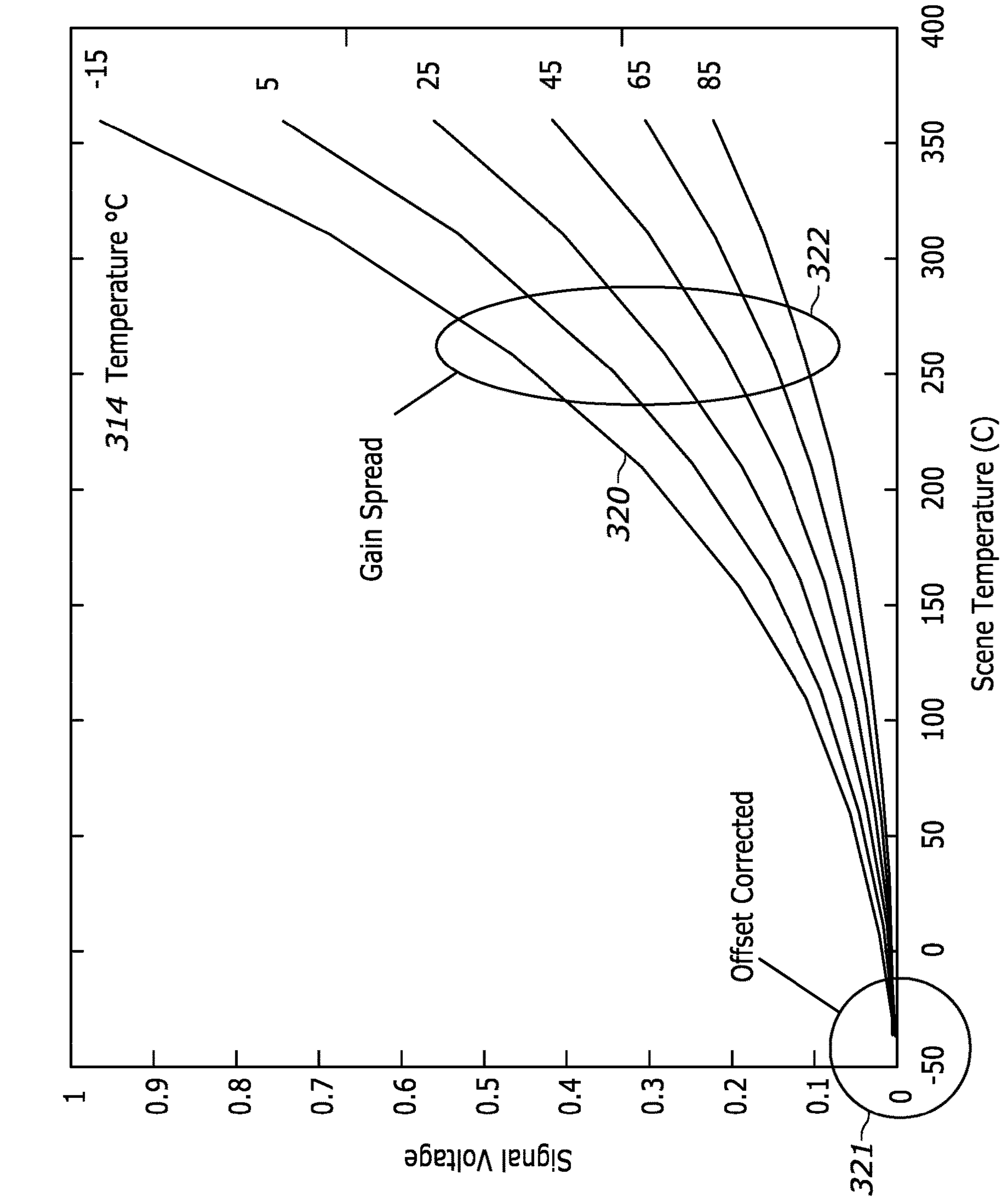
FIG. 4B is a graph of signals from the individual detector at various temperatures and signal levels corrected for offset.

Referring to FIG. 4B, the offset of the curves 320 has been adjusted at all junction temperatures such that the offset of the signals at the lowest temperature 321 (e.g., when the scene temperature is −40 C) is zero with respect to the reference detector when the reference is at −40 C and remains near zero across the entire operating junction temperature range. However, the gain for each curve, as shown by the gain spread 322, is different depending on the ROIC die temperature 314.

Figure 4C:
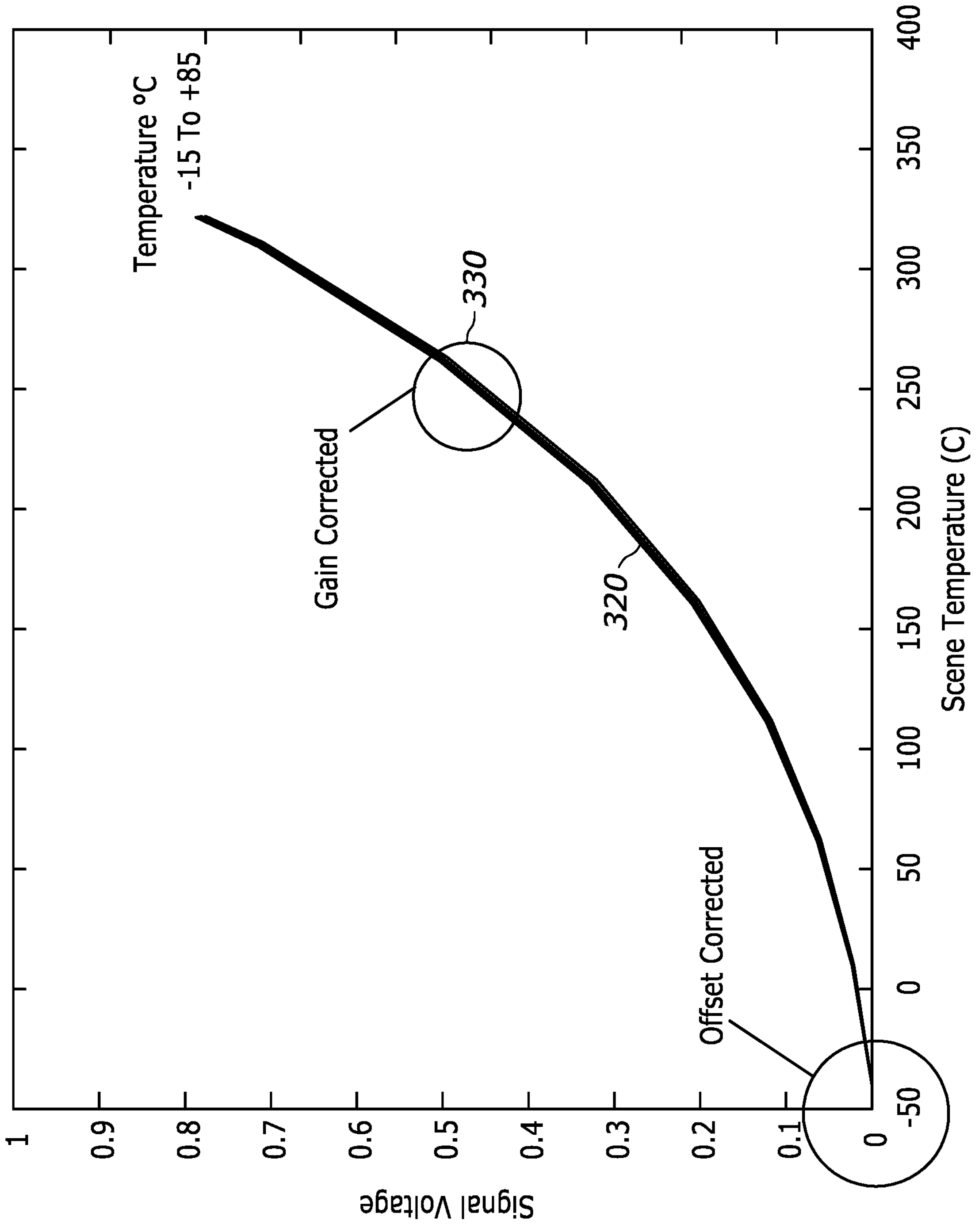
FIG. 4C is a graph of signals from the individual detector at various temperatures and signal levels corrected for offset and gain.

Referring to FIG. 4C, both the offset adjustment from FIG. 4B and gain adjustment are implemented. Consistency of gain 330 across the family of curves 320 is improved at all ROIC die temperatures. Additional dynamic range is no longer necessary to accommodate temperature variations of the curves.

Figure 5A:
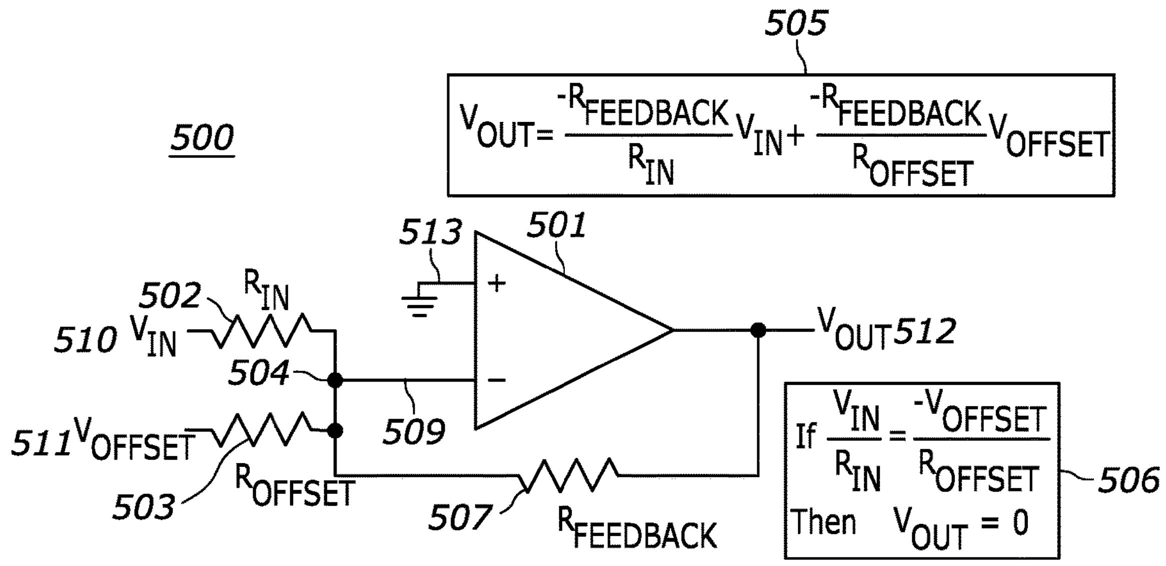
FIG. 5A is a drawing of an operational amplifier circuit that sums two incoming signals.

Referring now to FIG. 5A, a general closed loop inverting amplifier 500 has an input signal gain given by Gain=$V_{OUT}/V_{IN}=R_{FEEDBACK}/R_{IN}$. The amplifier feedback creates a virtual short between the negative input 509 and the positive amplifier ground 513. This enables multiple inputs 510 ($V_{IN}$) and 511 ($V_{OFFSET}$) to be summed at the inverting amplifier error summing node 504, each exhibiting gain described above. If $V_{IN}=-V_{OFFSET}$ and $R_{IN}=R_{OFFSET}$, the output offset voltage will be zero, independent of $R_{FEEDBACK}$.

The closed loop inverting amplifier 500 shown in FIG. 5A includes an operational amplifier 501 with two inputs. An upper input resistor 502 (RI) receives the voltage signal 510 ($V_{IN}$) from a thermal detector (e.g., a microbolometer) and a lower input resistor 503 ($R_{OFFSET}$) receives the voltage signal 511 ($V_{OFFSET}$) representing the offset in the detector signal that is to be corrected. In an embodiment, the signal 511 ($V_{OFFSET}$) is generated in response to a temperature of the ROIC (e.g., by a microbolometer that is thermally shunted to the ROIC die). At the summing node 504 (e.g., that is connected to the negative input 509 of the operational amplifier 501) the two signals 510 ($V_{IN}$) and 511 ($V_{OFFSET}$) are summed. The amount that the voltage at the output of the operational amplifier 501 changes in response to the summed input signal is determined by the ratio of the value of the feedback resistor 507 ($R_{FEEDBACK}$), to the values of the input resistors 502 ($R_{IN}$) and 503 ($R_{OFFSET}$) according to the gain formula 505. It can be seen, therefore, that the gain formula 505 provides a way, shown in the correction formula 506, to set the offset-corrected output from the operational amplifier 501 to zero.

Figure 5B:
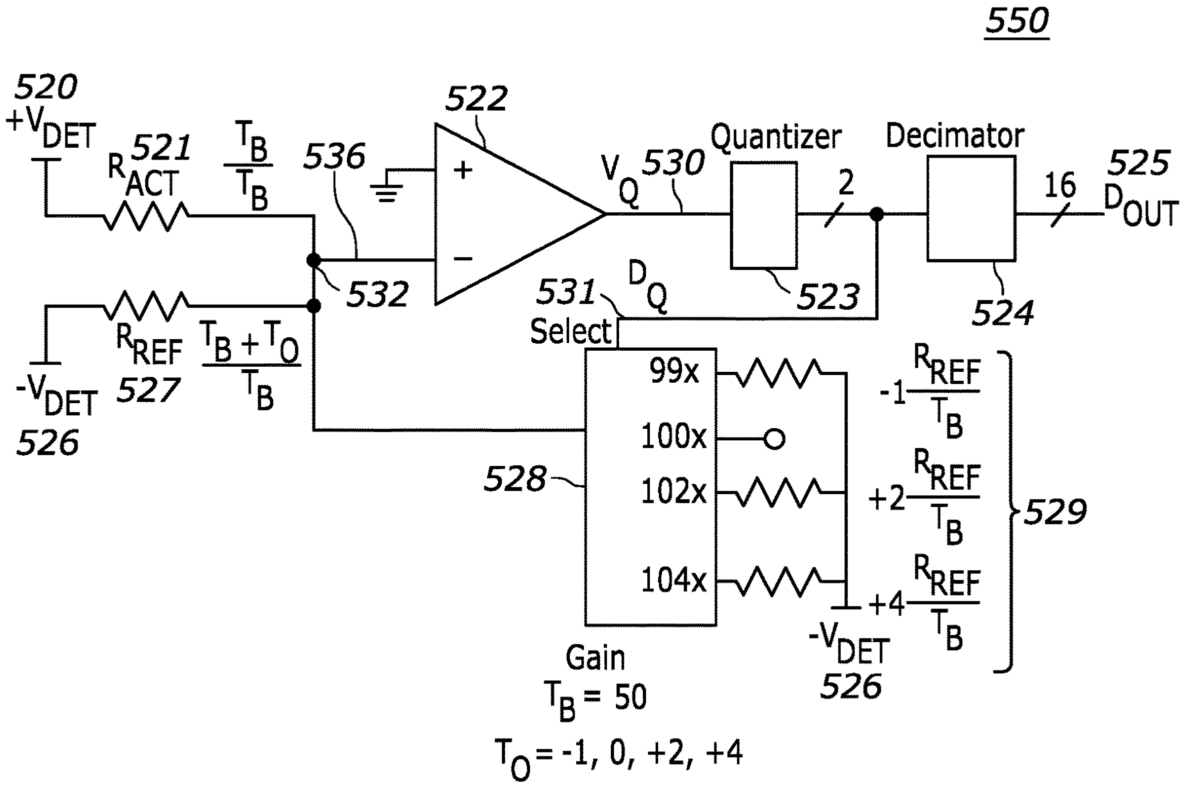
FIG. 5B is a drawing of a DSM with programmable feedback.

From the formulas 505 and 506, it can be seen that changing the values of any of the three resistors 502, 503, 507 ($R_{IN}$, $R_{OFFSET}$, $R_{FEEDBACK}$) will affect the output voltage so if the values of the resistors can be adjusted, the amount of correction applied to the offset can also be adjusted. A technique for making such an adjustment is disclosed herein. FIG. 5B is an example of a conversion circuit 550 in the form of a DSM ADC with adjustable feedback in which the effects of a change in pulse width of a PWM signal on the resultant signal amplitude at the input of the operational amplifier and in the feedback loop are represented by equivalent feedback resistors.

Referring to FIG. 5B, the conversion circuit 550 (e.g., a DSM ADC) is a closed loop data converter where the amplifying stage additionally shapes a noise transfer function (NTF). Closed loop amplifier offset and gain relationships (e.g., formulas 505 and 506) as presented in FIG. 5A still apply. An analog voltage 530 ($V_Q$) output from an operational amplifier 522 is quantized by a quantizer 523 into a low fidelity digital output 531 ($D_Q$) and fed back to a summing node 532 via a digital multiplexer 528. The DSM is an over sampled data converter. The signal from current source 520 ($+V_{DET}$) plus the quantization error (as determined in response to the low fidelity digital output 531 ($D_Q$)) is fed back and integrated by the NTF of the DSM to create a pulse density modulated digital output stream. The low fidelity digital output 531 ($D_Q$) is also fed forward to a decimator 524, which removes the high frequency NTF shaped noise and outputs a high fidelity digital output 525 (Dour).

In an embodiment, a pulse of a pulse width modulated (PWM) signal has a nominal width, which can be adjusted depending on the desired signal gain. As used herein, the nominal pulse width can be a pulse width that is predetermined or preselected based on some characteristic of the thermal imaging system, such as the ROIC die temperature. In an embodiment, the nominal pulse width is such that the amplitude of the integrated current is enough to cause the comparator to change state (e.g., cross over a threshold voltage of the comparator). A typical period of a PWM signal might have a duration of 60 clock cycles of a high speed clock and a nominal or base pulse width, or "on" time, ($T_{BASE}$ Or $T_B$) of 50 clock cycles of the high speed clock. In operation, the current from an active detector (current source 520) is connected to the summing node 532 at the negative input 536 of the operational amplifier 522 for the nominal pulse width (e.g., 50 clock cycles). The width of each pulse of the PWM signal is controlled in part by the digital output of the quantizer 523. In an embodiment, a 2-bit (4-level) output of the quantizer (e.g., $D_Q$) corresponds to a −1, 0, 2, or 4 clock cycle ($T_{OFFSET}$ or $T_O$) change in the feedback pulse width for pulse widths (e.g., on time/on period) of 49, 50, 52, 54 clock cycles, respectively. The IDAC current is subtracted from the current from the active detector at the summing node 532. In this example, the offset corrected PWM feedback signal corresponds to 49/50, 50/50, 52/50, 54/50 clock cycles, which equates to a desired signal offset correction of −2%, 0, +4%, +8% of $I_{REF}$.

In one embodiment, the feedback signal modulates the trail edge of the nominal pulse width of the PWM signal and a programmable DC offset is subtracted from the lead edge, adding 1/50 (2%) to the nominal pulse width, which is subtracted from the input signal.

In an embodiment, the nominal pulse width of the PWM signal is different for each of the ROIC die temperatures in the family of curves. In an embodiment, the number of high speed clock cycles for offset correction or ADC feedback are held constant during operation. For example, the set of clock cycle corrections of, for example, −1, 0, +2, +4 are held constant during operation. However, the set of offset corrections can be changed through reprogramming of the set of clock cycle corrections. Changing the nominal pulse width of the PWM signal effectively changes the gain of the detected signal by changing the ratio of the modulated/changed pulse clock cycle count to the nominal pulse clock cycle count. Selection and/or setting of the nominal pulse width ($T_B$) of the PWM signal can be made by various techniques including but not limited to a lookup table, histogram equalization, and direct measurement of ROIC die temperature via a reference detector or other sensor.

Referring again to FIG. 5B, a switched current closed loop topology can be considered. In switched current, resistors are synthesized using pulses of current. The reference current is generated outside the DSM, pulsed to synthesize an equivalent resistor 527 ($R_{REF}$) and pulsed into a PWM signal generated from a master clock having a clock cycle time, $T_M$, and a base output pulse width of $T_B=50*T_M$. The relative offset between the active detector (e.g., current source 520 ($+V_{DET}$)) and the reference detector (e.g., current sink 526 ($-V_{DET}$)) can be controlled by the relative pulse width of the respective currents into the summing node 532. The resulting offset current is then $(R_{ACT}*T_B/T_B)-(R_{REF}*(T_B+T_O)/T_B)$, where $T_B$ is the nominal or "base" pulse width, and $T_O$ is the offset (e.g., in number of clock cycles, where each clock cycle has a corresponding clock cycle time of $T_M$). In one embodiment, the offset, $T_O$, is added to the leading edge of the pulse of the PWM signal that is fed back to the summing node 532 for offset adjustment/correction. The gain value applied to the reference signal (e.g., current sink 526) can also be controlled by the feedback pulse width, the finest granularity being one clock cycle, $T_M$, of the master clock. In an embodiment, selection of the gain that is applied to the reference signal (e.g., current sink 526) is done for each digital feedback value, $D_Q$, using a select input of digital multiplexer 528. In one embodiment, values corresponding to the digital feedback value, $D_Q$, are added to the trailing edge of the feedback pulse as an offset adjustment to the gain and can take on values 529 of $\{-1, 0, +2, +4\}/T_B$. If the base pulse width, $T_B$, is 50, the resulting gain values would be {49×, 50×, 52×, 54×}.

Figure 5C:
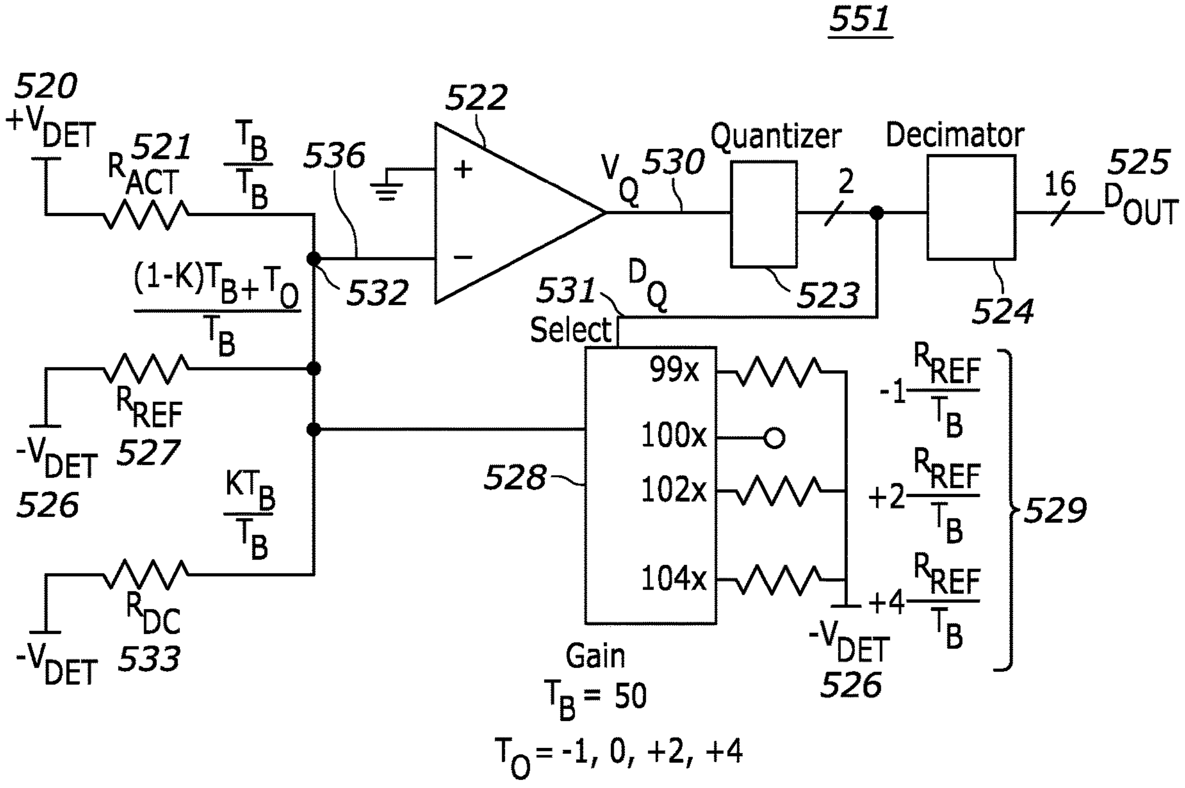
FIG. 5C is a drawing of another DSM with programmable feedback.

FIG. 5C is another example of a conversion circuit 551 in the form of a DSM ADC with adjustable feedback in which the effects of a change in pulse width of a PWM signal on the resultant signal amplitude at the input of the operational amplifier and in the feedback loop are represented by equivalent feedback resistors. The conversion circuit 551 in FIG. 5C is similar to the conversion circuit 550 described with reference to FIG. 5B. With reference to FIG. 5C, the signal from current source 520 (+$V_{DET}$) plus the quantization error (determined by digital output 531 ($D_Q$)) is fed back and summed by a DC signal created by equivalent resistor 533 ($R_{DC}$) before being integrated to create a pulse density modulated digital output stream. In this example, the IDAC current ($I_{REF}$) includes two parts; the offset corrected PWM feedback signal ((1−K)*$I_{REF}$) and a DC signal (K*$I_{REF}$), where 0≤K<1. In this example, the offset corrected PWM feedback signal equates to a desired signal offset correction of −2%, 0, +4%, +8% of (1−K)*$I_{REF}$. With reference to FIG. 5C, the relative offset between the active detector (e.g., current source 520 (+$V_{DET}$)) and the reference detector (e.g., current sink 526 (−$V_{DET}$)) can be controlled by the relative pulse width of the respective currents into the summing node 532. The resulting offset current is then $(R_{ACT}{*}T_B/T_B)-((1-K){*}R_{REF}{*}(T_B+T_O)/T_B)-(K{*}R_{REF}{*}T_B/T_B)$, where $T_B$ is the nominal or "base" pulse width, $T_O$ is the offset and 0≤K<1.

Figure 6A:
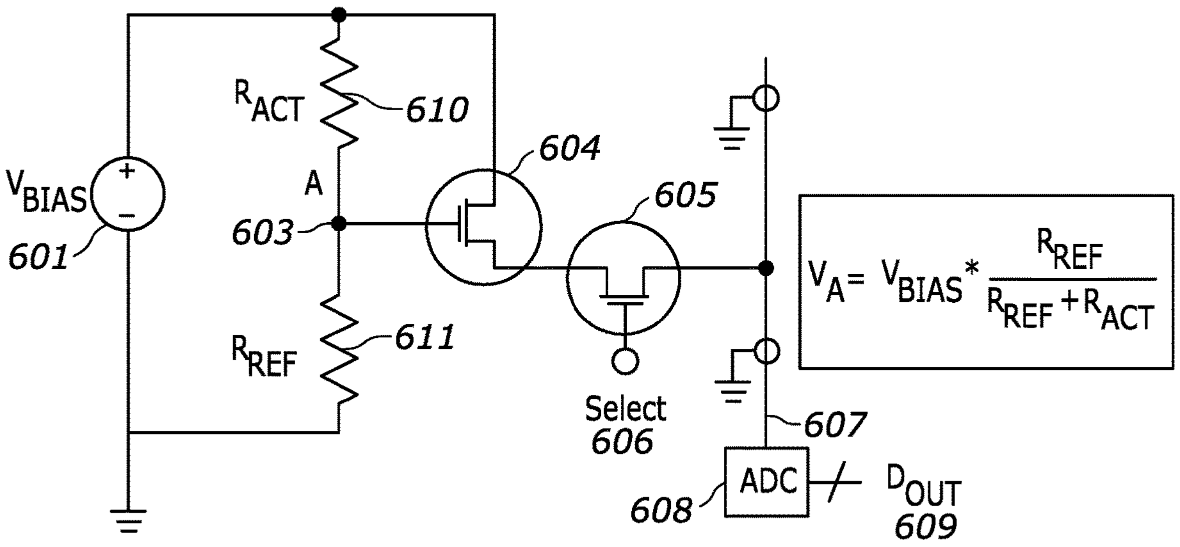
FIG. 6A is a drawing of a conventional readout circuit for an individual detector (e.g., an individual microbolometer).

FIG. 6A depicts an example of a conventional DSM ADC that includes an input amplifier to amplify a relatively small signal that is generated from a detector such as a thermal energy detector (e.g., a microbolometer). In FIG. 6A, the voltage source 601 ($V_{BIAS}$) establishes an operating range for a source follower buffer 604 (e.g., a transistor). The voltage at node A 603 is an input signal from a detector which is shown as a voltage generated by a resistive divider consisting of resistors 610 ($R_{ACT}$) and 611 ($R_{REF}$). Node A is connected to the input of the source follower buffer 604, which is connected through a series switch 605 (e.g., a transistor) controlled by a select signal 606 to send the corresponding signal at an appropriate time through a shielded column bus line 607 to an ADC 608, which produces a digital output 609 ($D_{OUT}$). Typically, the select lines for all amplifiers in a row are enabled simultaneously so the column lines all have the outputs from the same row together. This arrangement uses one ADC per column.

Figure 6B:
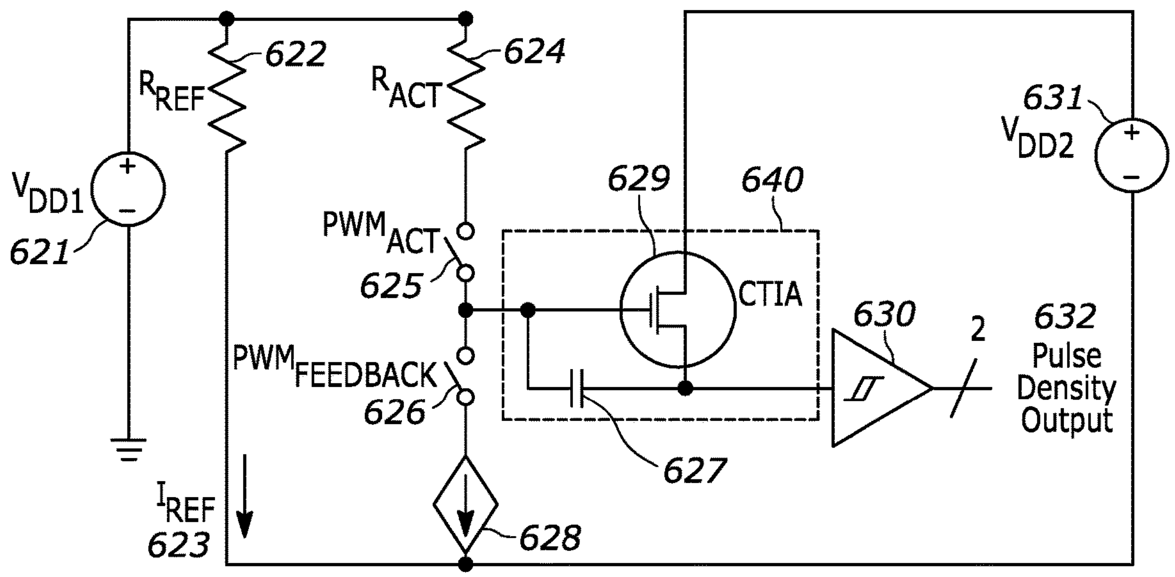
FIG. 6B is a drawing of a readout circuit for an individual detector using a readout circuit in accordance with an embodiment of the invention.

To provide an input signal appropriate to the DSM ADC, a conventional small-signal input amplifier (e.g., as shown in FIG. 6A) can be reconfigured in an embodiment to use resistors synthesized by a pulsed current as shown in FIG. 6B. The input stage for the DSM in an embodiment in accordance with the invention has an arrangement and function as shown in FIG. 6B. A voltage supply 621 for the resistors 622 ($R_{REF}$) and 624 ($R_{ACT}$) is shown at a value (e.g., $V_{DD1}$, such as 1.8V) that matches the typical output of a detector. Resistor 622 ($R_{REF}$) provides a reference current 623 ($I_{REF}$) in the nominal operating range of the circuit. The reference current 623 ($I_{REF}$) controls a second current source 628 (e.g., a current mirror), which provides the current signal to be modulated by the PWM signals. A PWM signal ($PWM_{ACT}$) controls a switch 625 to set the nominal number of pulses in the series and provides a standard charging current to the feedback capacitor 627 while a PWM signal ($PWM_{FEEDBACK}$) controls a switch 626 to change the number of pulses according to the results at the output of a quantizer. The feedback capacitor 627 and the transistor 629 constitute a CTIA 640 that provides a voltage to the comparator 630. A CTIA supply voltage 631 (e.g., $V_{DD2}$, such as 1.2V) is selected to match the input range of the comparator 630. The output from the comparator 630 is used as described herein to set the value of the feedback PWM signal $PWM_{FEEDBACK}$ for the next cycle.

Figure 6C:
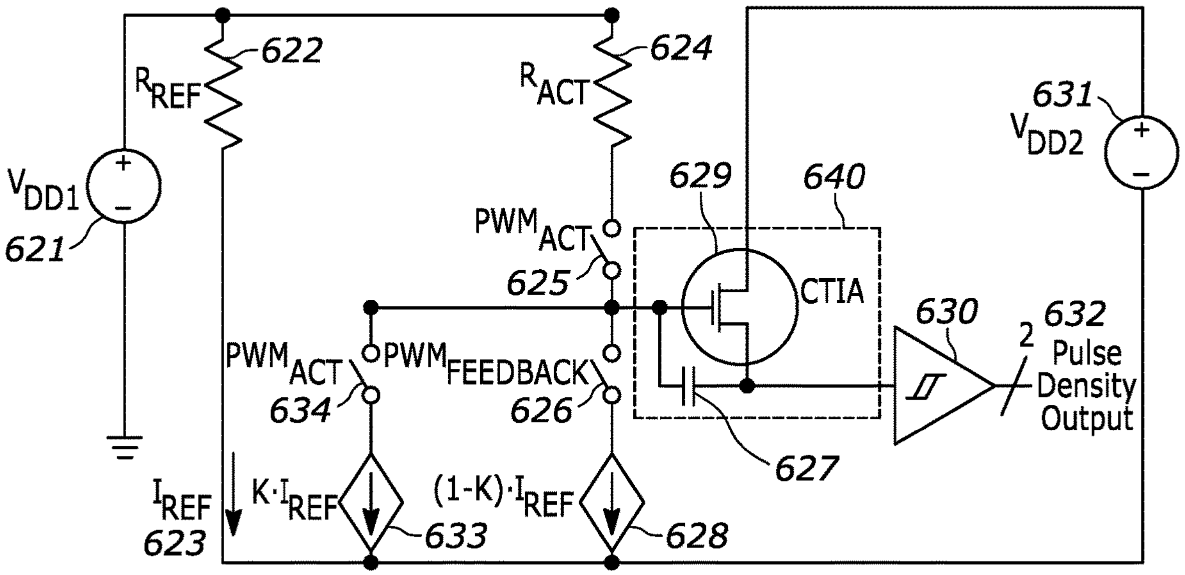
FIG. 6C is a drawing of a readout circuit for an individual detector using a readout circuit in accordance with an embodiment of the invention.

FIG. 6C is a drawing of another readout circuit for an individual detector using a readout circuit. The readout circuit in FIG. 6C is similar to the readout circuit described with reference to FIG. 6B. With reference to FIG. 6C, resistor 622 ($R_{REF}$) provides a reference current 623 ($I_{REF}$) in the nominal operating range of the circuit. The reference current 623 ($I_{REF}$) controls two other current sources 628 and 633 (e.g., two current mirrors), which provides the current signal to be modulated by the PWM signals. A PWM signal ($PWM_{ACT}$) controls a switch 625 to set the nominal number of pulses and provides a standard charging current to the feedback capacitor 627 while a PWM signal ($PWM_{FEEDBACK}$) controls a switch 626 to change the number of pulses according to the results at the output of a quantizer 630 and the PWM signal ($PWM_{ACT}$) controls a switch 634 to adjust the offset voltage at the input of CTIA 640.

Figure 7:
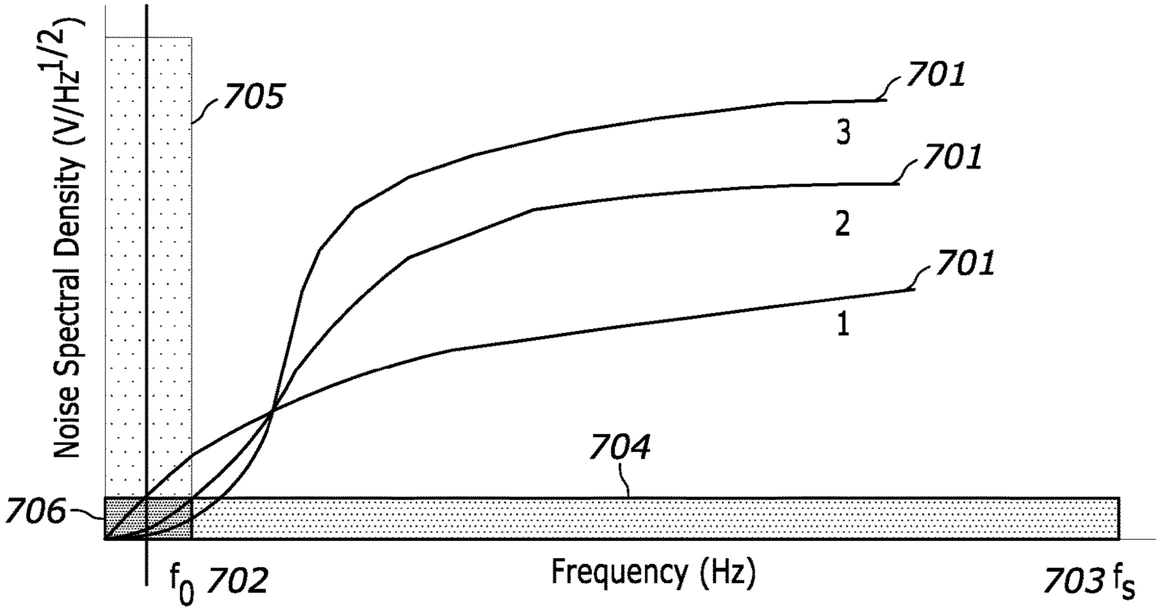
FIG. 7 is a graph of the noise characteristics of various DSM configurations.

DSMs may have more than one stage. For example, one, two, and three stages in various configurations are possible. In an embodiment, a two-stage (second-order) cascade of integrators with feedforward (CIFF) configuration is implemented to provide the appropriate tradeoff between noise and bandwidth for the detector type used. An example of this tradeoff is shown in FIG. 7. The three curves 701 represent the spectrum of the noise for one, two, and three stage DSMs, where $f_O$ 702 is the sampling frequency of the incoming signal and $f_S$ 703 is the oversampling clock frequency. The horizontal gray bar 704 indicates the total noise amplitude for all configurations and the vertical gray bar 705 and the width of the dark box 706 indicate the range of frequencies in the image to be digitized.

As the number of stages increases, the noise in the signal sampling band below $f_O$ 702 decreases while the noise at higher frequencies increases due to a process called noise shaping. In addition, the boundary between the lower and higher frequencies becomes sharper, making filtering out the higher frequency noise easier. In an embodiment, the noise reduction is sufficient with a two-stage DSM while the shape of the curve supports sufficient filtering. Adding more stages increases complexity while providing unneeded performance improvement.

Figure 8A:
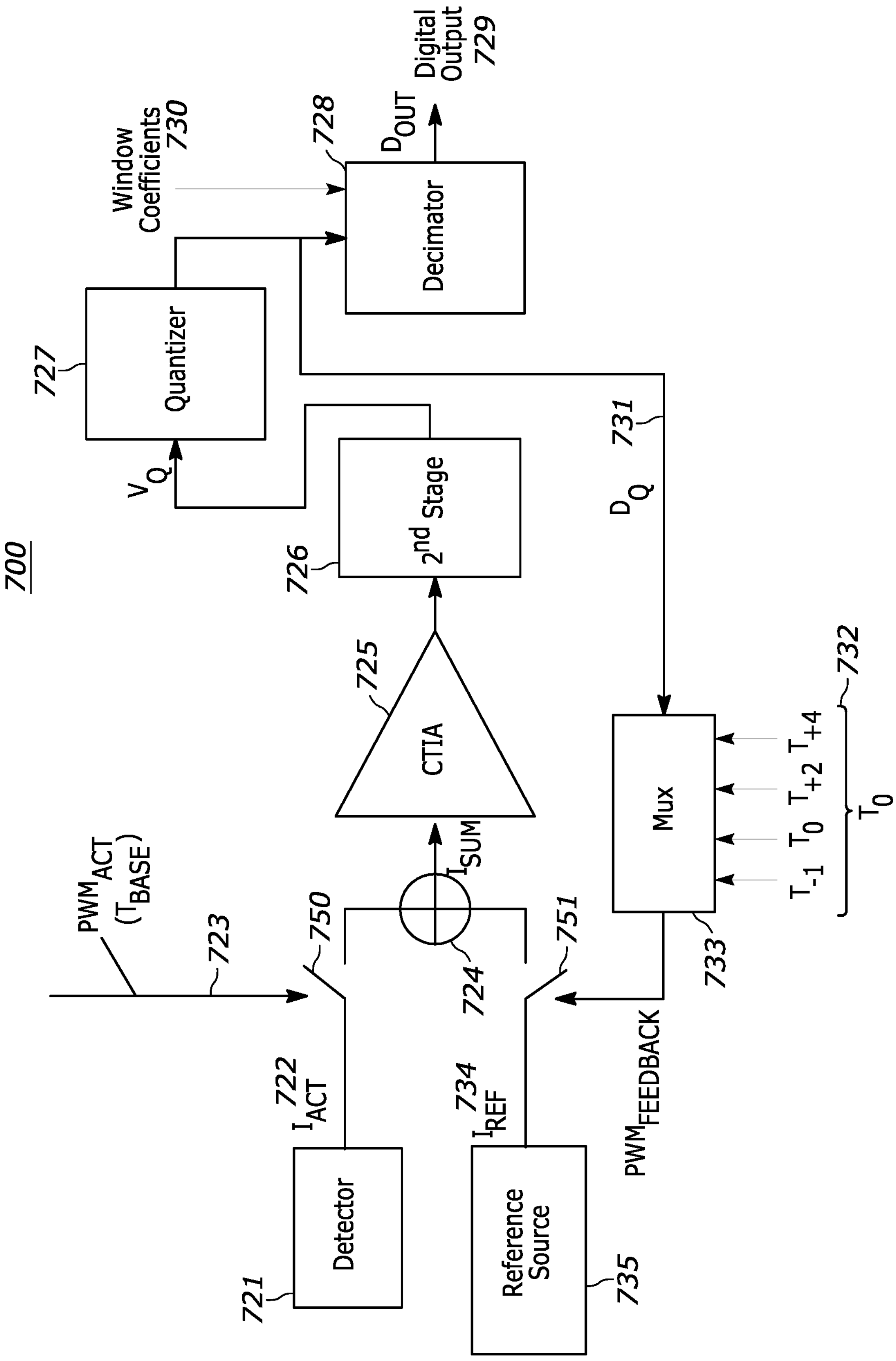
FIG. 8A is a block diagram of an embodiment of a readout circuit in accordance with an embodiment of the invention.

FIG. 8A is an example of a signal conversion system 700 that combines features described with reference to FIGS. 5B and 6B. An electrical current 722 ($I_{ACT}$) is generated by electromagnetic energy falling on a detector 721. The current 722 ($I_{ACT}$) is modulated by controlling a switch 750 with a PWM signal 723 ($PWM_{ACT}$) set to a nominal value ($T_B$) by a central clock generator (e.g., pulse width modular 205, FIG. 3) and the resulting signal is supplied to the summing node 724 of a CTIA 725. In particular, the PWM signal 723 ($PWM_{ACT}$ with nominal pulse width $T_B$) is a PWM signal that controls the on time of a switch 750 to control the amount of electrical current ($I_{ACT}$) that is applied to the summing node 724. The current ($I_{ACT}$) and the current ($I_{REF}$) are summed at the summing node 724, which provides a current ($I_{SUM}$) to the CTIA 725. In an embodiment, the current ($I_{ACT}$) is provided to a positive input of the summing node 724 and the current ($I_{REF}$) is provided to a negative input of the summing node 724 such that the resulting current ($I_{SUM}$) reflects the error, or difference, in the magnitude of the current between the current ($I_{ACT}$) and the current ($I_{REF}$). The signal from the CTIA 725 passes to a noise shaping circuit 726 (e.g., one or more additional stages of the DSM), and then to a quantizer 727, and to a decimator 728 from which a digital output 729 ($D_{OUT}$) representing the energy received by the detector 721, corrected for offset and gain, emerges. The window configuration used by the decimator 728 for reconstruction of the digital output 729 ($D_{OUT}$) is set by the values of the window coefficients 730 (which may be stored in window coefficient registers 204, FIG. 3).

The digital value 731 ($D_Q$) that is output from the quantizer 727 designates which of the various timing signals (e.g., timing offset, $T_O$) 732 (supplied to the multiplexer 733 representing correction quantities represented as digital pulse sequences) will be selected. For example, a 2-bit digital value 731 ($D_O$) is mapped to timing signals as: 0:$T_{-1}$, 1: $T_0$, 2: $T_{+2}$, 3:$T_{+4}$, where $T_{-1}=T_B-T_M$, $T_0=T_B$, $T_{+2}=T_B+2T_M$, and $T_{+4}=T_B+4T_M$. The selected timing signal, $T_O$, (e.g., $T_O=T_{-1}$, $T_0$, $T_{+2}$, or $T_{+4}$) controls the amount of electrical current 734 ($I_{REF}$) that is supplied from a reference source 735 that gets applied to the summing node 724. In particular, the selected timing signal, $T_O$, is a PWM signal (e.g., $PWM_{FEEDBACK}$ with pulse width $T_O$) that controls the on time of switch 751 to control the amount of electrical current ($I_{REF}$) that is applied to the summing node 724 along with the electrical current ($I_{ACT}$). Although an example set of preconfigured timing offset signals (e.g., $T_{-1}$, $T_0$, $T_{+2}$, $T_{+4}$) is described, a preconfigured set of timing offset signals with other magnitudes of offset (e.g., $T_w$, $T_x$, $T_y$, $T_z$, where w, x, y, and z are, for example, integer numbers of clock cycles) are possible. Additionally, a wider set of timing offset signals may be used with a digital value 731 ($D_O$) that is larger than 2 bits. In an embodiment, the reference source 735 is a reference detector such as a microbolometer that is thermally shunted to the ROIC, however, the reference source 735 that produces the current ($I_{REF}$) may take some other form.

Figures 8B, 8C:
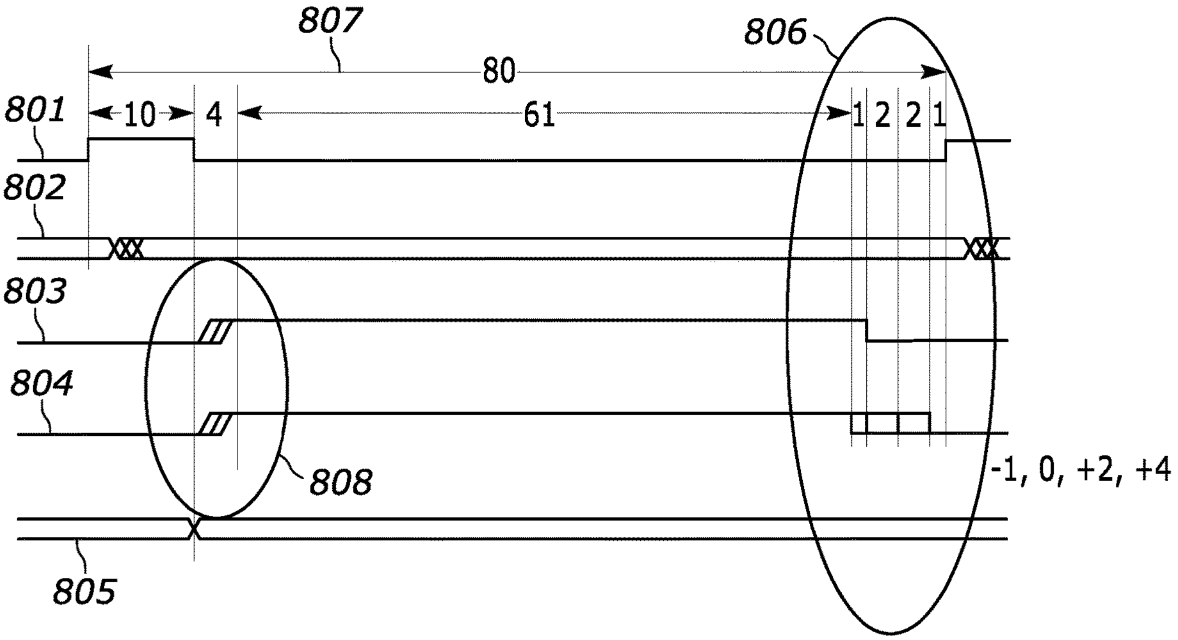
FIG. 8B is a set of waveforms produced by a readout circuit such as the readout circuit of FIG. 8A.
FIG. 8C is a table of timing values for the waveforms in FIG. 8B.

The sequence of events implemented at the signal conversion system 700 (FIG. 8A) may be understood from an examination of the time-aligned waveforms shown in FIG. 8B. For the time-aligned waveforms in FIG. 8B, the durations are expressed in clock cycles (e.g., $T_M$) with, for example, a total measurement period 807 of 80 clock cycles of, for example, a 15 MHz master clock, which translates to 80×1/15 MHz=5.33 μsec per measurement period, with a nominal or base pulse width ($T_B$) of 61 clock cycles. A table of durations is shown in FIG. 8C. The top waveform 801 shows that the comparator (e.g., quantizer 727) is active for 10 clock cycles at the beginning of the measurement period. During that same interval, the output from the integrator (e.g., CTIA 725) is used by the quantizer 727 to produce the digital value 802 ($D_Q$) that controls the feedback selector (e.g., the multiplexer 733). Waveform 803 represents the PWM signal $PWM_{ACT}$ (which controls the on time of switch 750) and the waveform 804 represents the PWM signal $PWM_{FEEDBACK}$ (which controls the on time of switch 751). An example of the offset that can be applied to waveform 804 (e.g., the PWM signal $PWM_{FEEDBACK}$) is indicated at 806. In the example of waveform 804, the offset correction 806 is applied at the trailing edge of the pulse of the PWM signal. FIG. 8B also illustrates gain adjustment values 808 (which can come from, for example, a storage register) that are applied to the leading edges of the waveforms 803 and 804. For example, the PWM signals $PWM_{ACT}$ and $PWM_{FEEDBACK}$ are gain adjusted by adding/subtracting some number of clock cycles to/from the nominal or base pulse width, $T_B$. In the example shown in FIG. 8B, the gain adjustment involves the addition of 4 clock cycles (e.g., $4T_M$) to the leading edge of the pulse of each of the PWM signals, $PWM_{ACT}$ and $PWM_{FEEDBACK}$. In an embodiment, the relative position of the transitions in the waveform 803 (e.g., $PWM_{ACT}$) and the waveform 804 (e.g., $PWM_{FEEDBACK}$) controls the polarity of the adjustments. The bottom waveform 805 indicates that the noise-shaping filter is applied after the decimator 728 each cycle. The number of clock cycles required will depend on the filter type chosen.

Figure 8D:
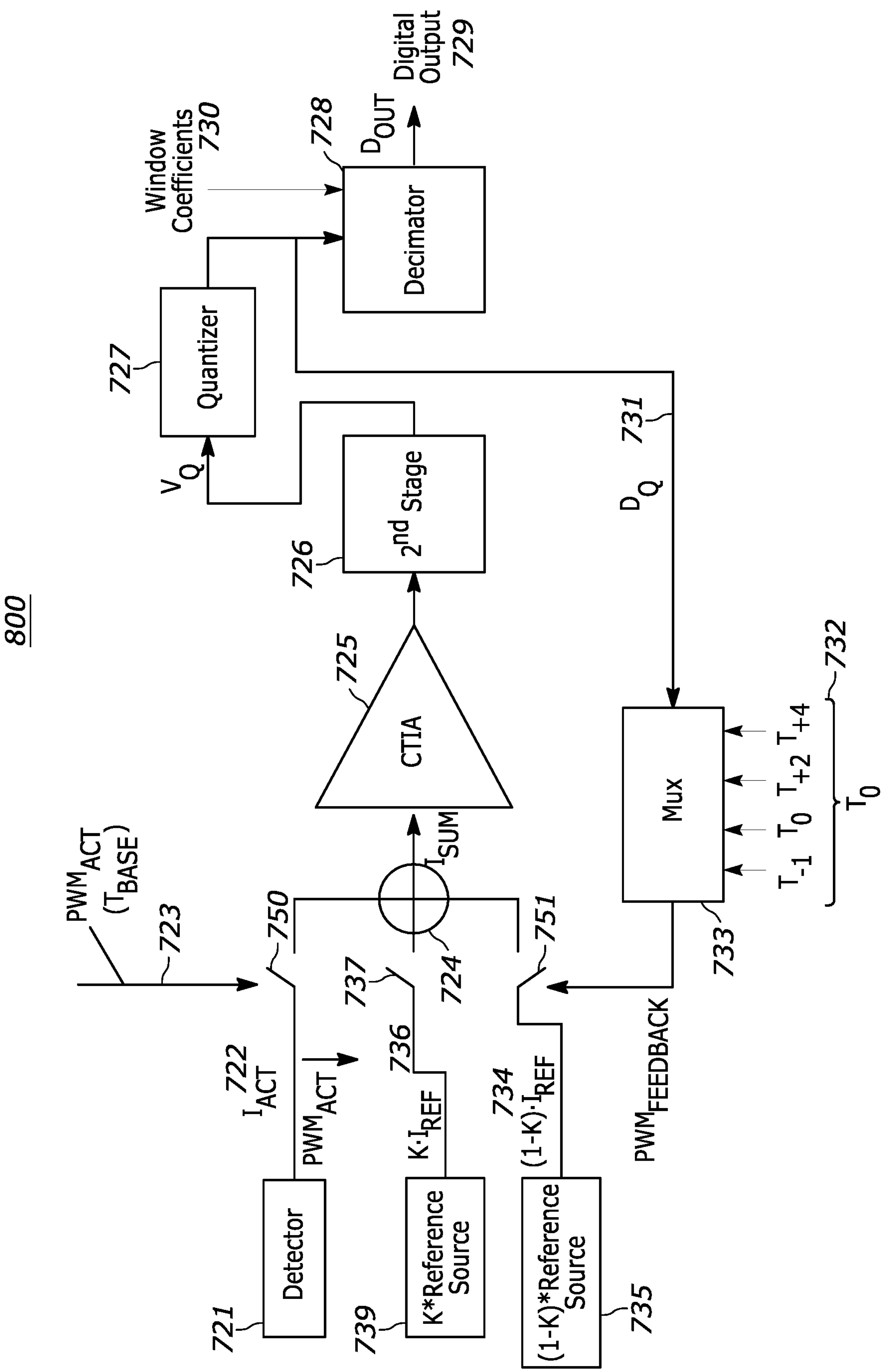
FIG. 8D is a block diagram of another embodiment of a readout circuit in accordance with an embodiment of the invention

FIG. 8D is another example of a signal conversion system 800 that combines features described with reference to FIGS. 5C and 6C. The signal conversion system 800 of FIG. 8D is similar to the signal conversion system 700 described with reference to FIG. 8A. In this example, the current 722 ($I_{ACT}$) is modulated by controlling a switch 750 with a PWM signal 723 ($PWM_{ACT}$) and the resulting signal is supplied to the summing node 724 of a CTIA 725 to be summed with current 734 ($(1-K)*I_{REF}$) from a reference source 735 that is modulated by controlling a switch 751 and current 736 ($K*I_{REF}$) from a reference source 739 that is modulated by controlling a switch 737. The PWM signal 723 ($PWM_{ACT}$ with nominal pulse width $T_B$) is a PWM signal that controls the on time of a switch 750 to control the amount of electrical current ($I_{ACT}$) that is applied to the summing node 724 and a switch 737 to control the amount of ($K*I_{REF}$) that controls the DC level of $I_{SUM}$. The current ($I_{ACT}$) and the currents ($(1-K)*I_{REF}$ and $K*I_{REF}$) are summed at the summing node 724, which provides a current ($I_{SUM}$) to the CTIA 725. In an example, time-aligned waveforms similar to those shown in FIG. 8B apply also to the signal conversion system of FIG. 8D.

In an embodiment, the analog to digital conversion can be accomplished with a flash converter or any other ADC type in which the feedback loop is not available for use in providing adjustments. In such an embodiment, where the summing node and integrator are not present, the input signal is converted into a pulse width with an integrator and comparator which are periodically reset by a sampling clock. This integrated signal is connected to the positive input of a summing node. A pulse train with a configuration as described herein is connected to the negative input of the summing node to produce a pulse train that represents the adjusted signal. The pulse train is integrated to produce a voltage representing the adjusted signal, which is then connected to the input of an ADC.

A DSM is an oversampled ADC that uses a decimation low pass filter to extract the high bit count output from the one or two bit DSM output. This function is often implemented using a cascade of integrating comb (CIC) filters or by half band filters (HBF). Both of these techniques require significant temporary storage per ADC. In one embodiment, a window filter can be used as a decimation filter. The window coefficient storage (e.g., window coefficient registers 204, FIG. 3) can be shared among numerous ADCs making it a much smaller implementation than CIC or HBF. This technique is common for FFTs and typical window functions include Hanning, Hamming, Kaiser, Bartlett, boxcar. A digital accumulator can be configured to implement a boxcar (rectangular or averaging) window with relatively low performance versus the other window functions. Using a Hanning window with 11-bit window coefficients, the final output of each ADC is a 16-bit signal (13.4 effective number of bits (ENoB)) that has been junction temperature compensated for both offset and gain in the analog domain.

Figure 9B:
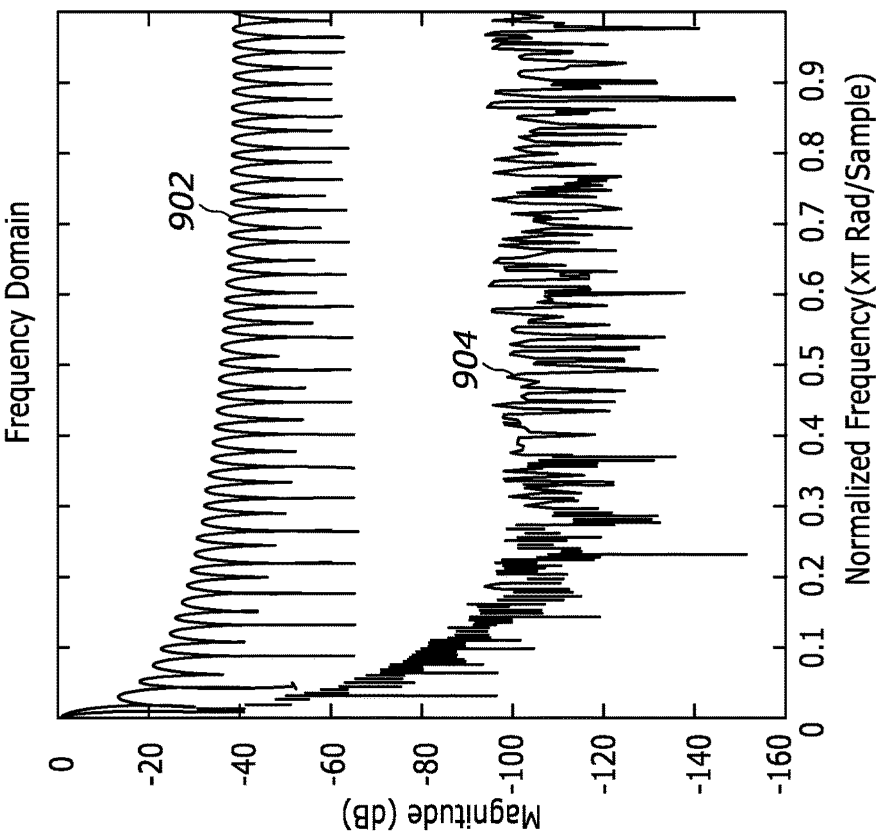
FIGS. 9A and 9B are graphs of noise characteristics of a DSM.
Figure 9A:
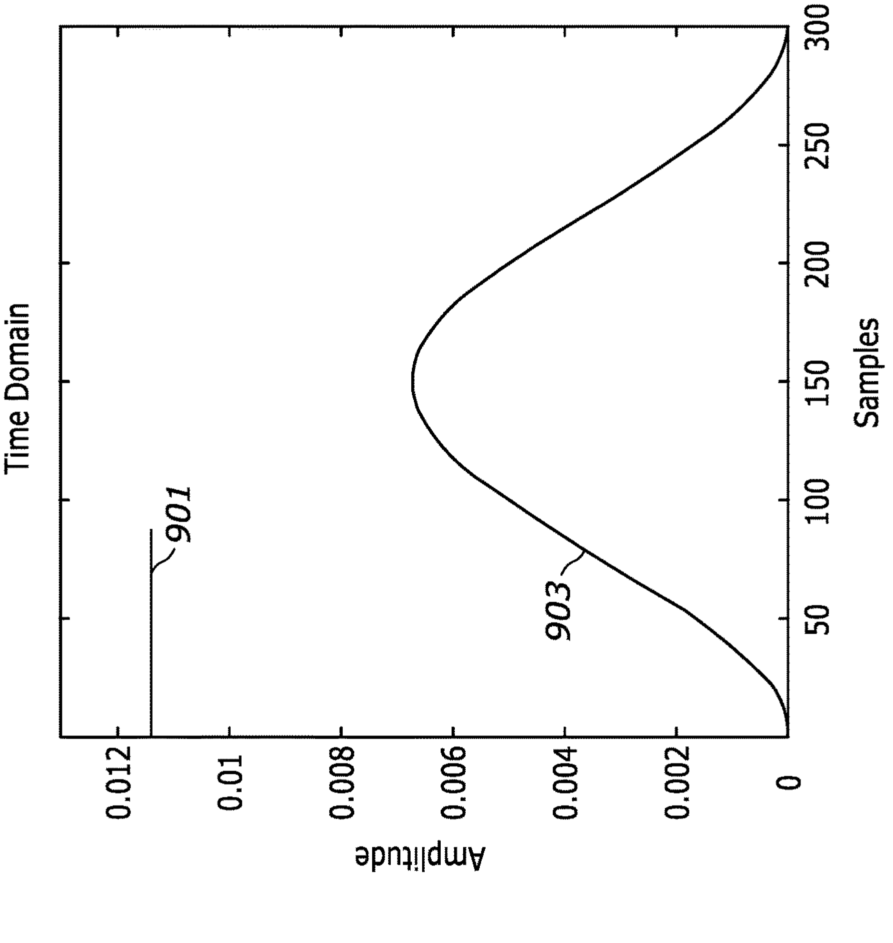

An example of the effect on noise performance is shown in FIGS. 9A and 9B. FIG. 9A shows two filtering characteristics. The top filtering characteristic 901 indicates that the processing algorithm is an equal-weighted average of 86 samples of the output data while the bottom filtering characteristic 903 shows a 300-sample Hanning window. Each of these filtering characteristics 901 and 903 would be incremented one sample at a time to produce the resultant processed output. FIG. 9B shows an example of such results. The top filtering results curve 902 is the noise attenuation resulting from the application of the 86-sample averaging and the bottom filtering results curve 904 is the result of applying the Hanning window. An improvement in noise performance of approximately 60 dB is clearly evident.

Figure 10:
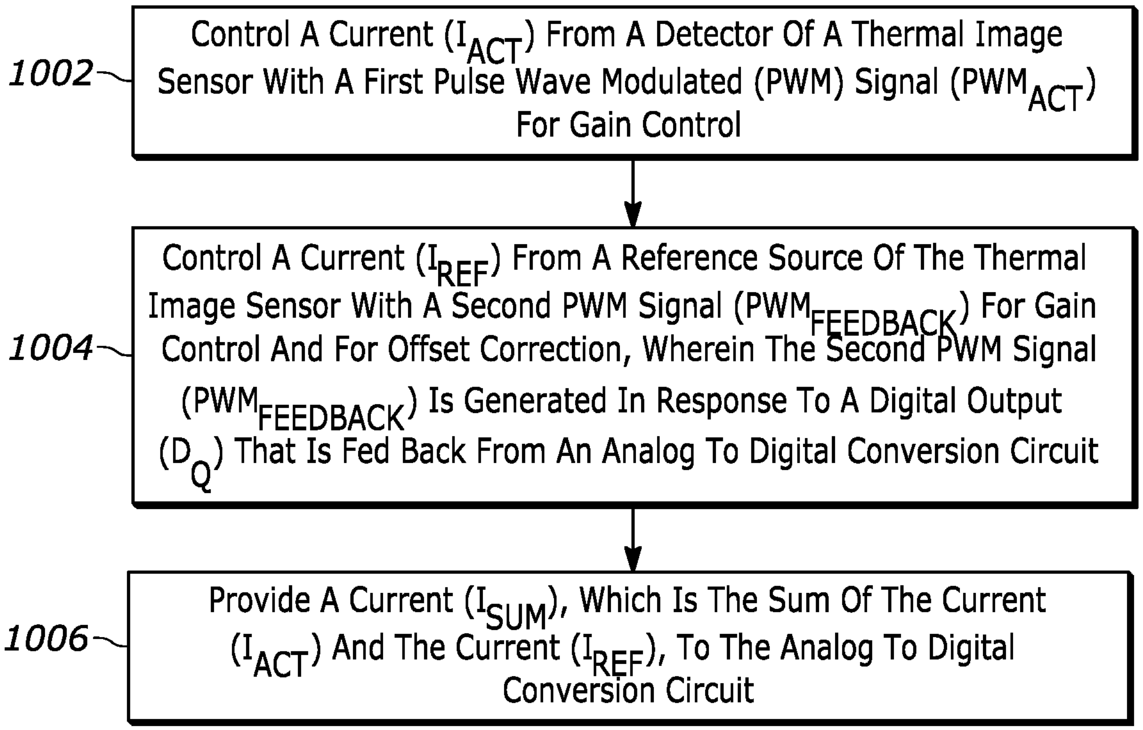
FIG. 10 is a process flow diagram of a method for analog to digital conversion for signals from a thermal image sensor.

FIG. 10 is a process flow diagram of a method for analog to digital conversion for signals from a thermal image sensor. At block 1002, a current ($I_{ACT}$) from a detector of a thermal image sensor is controlled with a first pulse width modulated (PWM) signal ($PWM_{ACT}$) for gain control. At block 1004, a current ($I_{REF}$) from a reference source of the thermal image sensor is controlled with a second PWM signal ($PWM_{FEEDBACK}$) for gain control and for offset correction, wherein the second PWM signal ($PWM_{FEEDBACK}$) is generated in response to a digital output ($D_Q$) that is fed back from an analog to digital conversion circuit. At block 1006, a current ($I_{SUM}$), which is the sum of the current ($I_{ACT}$) and the current ($I_{REF}$), is provided to the analog to digital conversion circuit.

Figure 11:
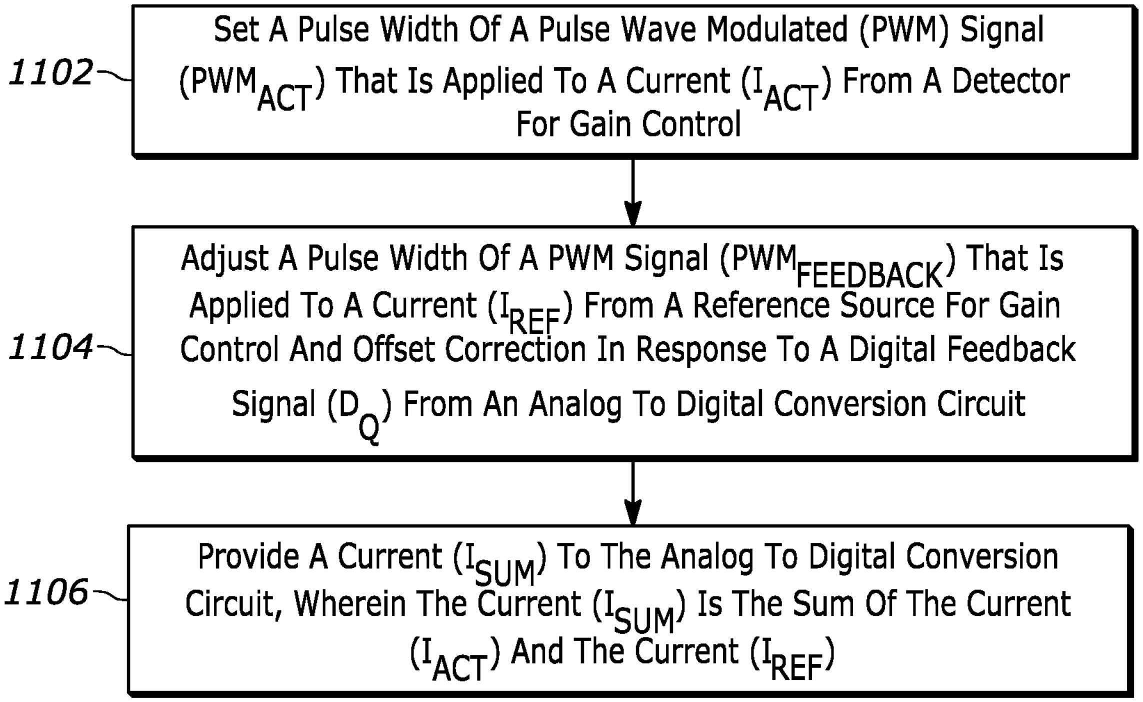
FIG. 11 is a process flow diagram of another method for analog to digital conversion for signals from a thermal image sensor.

FIG. 11 is a process flow diagram of another method for analog to digital conversion for signals from a thermal image sensor. At block 1102, a pulse width of a pulse width modulated (PWM) signal ($PWM_{ACT}$) that is applied to a current ($I_{ACT}$) from a detector is set for gain control. At block 1104, a pulse width of a PWM signal ($PWM_{FEEDBACK}$) that is applied to a current ($I_{REF}$) from a reference source for gain control and offset correction is adjusted in response to a digital feedback signal ($D_Q$) from an analog to digital conversion circuit. At block 1106, a current ($I_{SUM}$) is provided to the analog to digital conversion circuit, wherein the current ($I_{SUM}$) is the sum of the current ($I_{ACT}$) and the current ($I_{REF}$).

Additional disclosure includes the following.

A thermal imaging subsystem including a cooling apparatus, a focal plane array responsive to thermal energy and in thermal communication with the cooling apparatus, wherein the focal plane array includes gain and offset adjustment circuits as disclosed herein, and a cold shield in thermal communication with the cooling apparatus and which insulates the focal plane array from stray thermal radiation, without maintaining a vacuum. The thermal imaging subsystem, wherein the cooling apparatus is a Peltier Thermal Electric Cooler (TEC). The thermal imaging subsystem, wherein the TEC cooler is in thermal communication with a heat sink. The thermal imaging subsystem, wherein said focal plane array comprises a micro-bolometer detector array fabricated from vanadium oxide ($VO_x$) or polycrystalline silicon (polysilicon). The thermal imaging subsystem, wherein the focal plane array includes an infrared detector fabricated at least in part using Colloidal Quantum Dots as an absorbing layer. The thermal imaging subsystem, wherein the cold shield is held predominantly at the same temperature as the focal plane array by the cooling apparatus. The thermal imaging subsystem, wherein said cold shield has low emissivity (reflect stray radiation) on outside, but high emissivity (absorb reflected radiation) on side facing focal plane array. The thermal imaging subsystem, wherein said cold shield also acts as a cold aperture stop. The thermal imaging subsystem, wherein back side of said focal plane array is bonded directly to the cooling apparatus, providing low thermal resistance. The thermal imaging subsystem, which additionally includes a flexible flat cable (FFC) wherein said focal plane array electrical connections are made on the top side of the focal plane array using isotropic adhesive to said FFC, leaving the back side of focal plane array available for thermal bonding. The thermal imaging subsystem, which additionally includes a printed circuit board with thermal vias wherein one side is in thermal communication with the focal plane array and the opposite side is in thermal communication with the cooling apparatus.

A system sensing a thermal image using a focal plane array includes a plurality of electrodes in communication with active sensors responsive to infrared radiation and biased to output a signal current, a plurality of sensors thermally shunted to the substrate which output a reference current responsive to substrate temperature, a Read-Out Integrated Circuit (ROIC), which further includes a plurality of Capacitive Trans-Impedance Amplifier (CTIA) current input stages in communication with said electrodes and each outputting an integrated error voltage, and a plurality of quantizers responsive to the integrated error voltages and outputting a digital value, a binary mode, current output digital to analog converter (DAC) feedback where the current amplitude is responsive to the reference current and the nominal on time of the current is controlled to predominantly cancel the infrared sensor minimum current and is additionally responsive to the quantizer digital output value, a current summing node which generates an error signal proportional to the difference between the sensor input signal and the feedback DAC signal, a pulse width modulation (PWM) generator for controlling the nominal and feedback pulse widths. The system, wherein the CTIA acts as the first stage of a multi-stage Delta-Sigma Modulator (DSM). The system, wherein the DSM is a second order DSM with four level quantizer. The system, wherein said focal plane array further comprises a micro-bolometer detector array fabricated from vanadium oxide ($VO_x$) or polycrystalline silicon (polysilicon) in communication with said electrodes. The system, wherein said thermally shunted sensors are micro-bolometers fabricated similarly to the active sensors. The system, wherein said ROIC further including a plurality of digital decimation filters responsive to the quantizer outputs.

A method for operating a delta sigma modulator (DSM) in which the feedback signal includes of a train of pulses where the duration of each pulse is short enough to allow inclusion of at least 20 pulses in the period of the DSM comparator clock, the number of pulses in the train is controlled by an external gating signal, the train includes of a central section of some number of fixed pulses where the one or more pulses in the train are added or subtracted by a signal such that they represent a desired adjustment in offset, the one or more pulses in the train are added or subtracted by a signal such that they represent a desired adjustment in gain, the amplitude of the pulses is such that the central section produces the signal required to produce the integrated total required to cause the comparator to change state. The method includes determining the number of pulses to be added to the pulse train for each of the desired corrections, offset and gain. In an example of the method, the pulses representing the offset adjustment are placed before the central section and the pulses representing the gain adjustment are placed following the central section. In an example of the method, the pulses representing the gain adjustment are placed before the central section and the pulses representing the offset adjustment are placed following the central section. In an example of the method, the pulses representing the offset adjustment and the gain adjustment are placed together with either adjustment first either before the central section or following the central section. In an example of the method, the amplitude of the pulses is adjustable.

A system for Analog to Digital Conversion which integrates controls to adjust the ADC conversion range to match the input signal includes a charge summing node, a means to inject charge from the input signal into the charge summing node, a Delta Sigma Modulator including a Capacitive Transimpedance Amplifier (CTIA) responsive to said charge summing node and which integrates the charge and contributes in part the Noise Transfer Function (NTF) of the Delta Sigma Modulator, a plurality of additional noise shaping stages that contribute in part to the NTF of the DSM, a plurality of quantizers with threshold levels which convert the noise shaped analog output of the DSM stages to digital output bit(s), means to generate a reference current, means to inject anti-charge from the charge summing node, responsive to the quantizer digital output(s), the reference current and at least one of a gain control signal, an offset control signal, and means to decimate the quantizer bits including digital filtering, sample rate reduction and data bit width growth. The system, wherein the reference current is generated using a sensor responsive to the die temperature. The system, wherein the anti-charge injection value is controlled using Pulse Width Modulation (PWM) of the reference current where the PWM has a nominal pulse width of $T_{BASE}$. The system, wherein the conversion gain is proportional to the ratio of the quantizer feedback values vs. $T_{BASE}$. The system, wherein the quantizer feedback signal modulates the trail edge of the PWM pulse. The system, wherein the offset value is predominately proportional to $T_{BASE}$. The system, wherein the offset value modulates the lead edge of the PWM signal. The system, wherein the offset value is responsive to a Fractional-N synthesized DC value from a Delta Sigma Modulator.

An apparatus to generate an image includes an array of sensors responsive to electromagnetic energy, an array of Delta Sigma Modulator (DSM) Analog to Digital Converters (ADCs) and decimation filters (including accumulators) on a monolithic substrate in communication with the array of sensors and responsive to a plurality of Pulse Width Modulated (PWM) signals, means to generate a plurality of PWM signals to adjust the ADC process to the dynamic range of the sensors, said adjustments responsive to at least one of gain control signals, and offset control signals, means to generate the window coefficients used by the decimation filters, and means to communicate the digital output from the accumulators to an image output formatter. The apparatus, wherein the sensors are microbolometers responsive to electromagnetic spectrum within the thermal wavelengths (3 um-5 um and 8 um-14 um). The apparatus, wherein window coefficients are predominantly a Hanning function. The apparatus, wherein the array of sensors arranged as a two dimensional imaging array comprising rows and columns and the array of DSM ADCs is arranged as a two dimensional array of tiles, each tile in communication with a two dimensional subarray of sensors. The apparatus, wherein the PWM signals are synchronized outside the array of DSMs and then driven along the columns of tiles, said tiles buffer the signals internally and re-buffer the signals to adjacent column tiles. The apparatus, wherein the window coefficients are synchronized outside the array of DSMs and then driven along the rows of tiles, said tiles buffer the signals internally and re-buffer the signals to adjacent row tiles. The apparatus, wherein each PWM gain and offset controls are specific for the active tile which those synchronized signals are driving.

The above desirable solution to the problems of offset and gain adjustment are controlled by digital means and may include adjustments that incorporate both corrections for errors introduced by the conversion process and adjustments based on desired changes to the input analog signal.

The above-described techniques can be incorporated into a shutterless infrared/thermal camera.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method comprising:

controlling a current ($I_{ACT}$) from a detector of a thermal image sensor with a first pulse width modulated (PWM) signal ($PWM_{ACT}$) for gain control;

controlling a current ($I_{REF}$) from a reference source of the thermal image sensor with a second PWM signal ($PWM_{FEEDBACK}$) for gain control and for offset correction, wherein the second PWM signal ($PWM_{FEEDBACK}$) is generated in response to a digital output ($D_Q$) that is fed back from an analog to digital conversion circuit; and providing a current ($I_{SUM}$), which is the sum of the current ($I_{ACT}$) and the current ($I_{REF}$), to the analog to digital conversion circuit.

2. The method of claim 1, wherein:

controlling the current ($I_{ACT}$) from the detector involves making a gain adjustment to the first PWM signal ($PWM_{ACT}$); and controlling the current ($I_{REF}$) from the reference source involves making the gain adjustment and an offset adjustment to the second PWM signal ($PWM_{FEEDBACK}$).

3. The method of claim 1, wherein generating the second PWM signal ($PWM_{FEEDBACK}$) involves selecting a timing offset in response to the digital output ($D_Q$).

4. The method of claim 1, wherein generating the second PWM signal ($PWM_{FEEDBACK}$) involves selecting an offset ($T_O$) from a preconfigured set of offsets ($T_w$, $T_x$, $T_y$, $T_z$) in response to the digital output ($D_Q$).

5. A method comprising:

setting a pulse width of a pulse width modulated (PWM) signal ($PWM_{ACT}$) that is applied to a current ($I_{ACT}$) from a detector for gain control;

adjusting a pulse width of a PWM signal ($PWM_{FEEDBACK}$) that is applied to a current ($I_{REF}$) from a reference source for gain control and offset correction in response to a digital feedback signal ($D_Q$) from an analog to digital conversion circuit; and providing a current ($I_{SUM}$) to the analog to digital conversion circuit, wherein the current ($I_{SUM}$) is the sum of the current ($I_{ACT}$) and the current ($I_{REF}$).

6. A system for analog to digital conversion for signals from a thermal image sensor, the system comprising:

an analog to digital conversion circuit;

a summing node configured to provide a current ($I_{SUM}$) to the analog to digital conversion circuit for analog to digital conversion;

means for controlling a current ($I_{ACT}$) from a detector of a thermal image sensor with a first pulse width modulated (PWM) signal ($PWM_{ACT}$) for gain control; and means for controlling a current ($I_{REF}$) from a reference source of the thermal image sensor with a second PWM signal ($PWM_{FEEDBACK}$) for gain control and offset correction, wherein the second PWM signal ($PWM_{FEEDBACK}$) is generated in response to a digital output ($D_Q$) that is fed back from the analog to digital conversion circuit;

wherein the current ($I_{ACT}$) and the current ($I_{REF}$) are summed at the summing node to generate the current ($I_{SUM}$).

7. A system for analog to digital conversion for signals from a thermal image sensor, the system comprising:

a delta sigma modulator (DSM) that generates a digital output ($D_Q$) in response to a current ($I_{SUM}$);

a first switch that controls a current ($I_{ACT}$) from a detector of the thermal image sensor, wherein the first switch is controlled with a first pulse width modulated (PWM) signal ($PWM_{ACT}$) for gain control;

a second switch that controls a current ($I_{REF}$) from a reference source of the thermal image sensor, wherein the second switch is controlled with a second PWM signal ($PWM_{FEEDBACK}$) for gain control and offset correction;

a summing node configured to provide the current ($I_{SUM}$) to the DSM, wherein the current ($I_{SUM}$) is generated from the sum of the current ($I_{ACT}$) and the current ($I_{REF}$); and a multiplexer that receives the digital output ($D_Q$) of the DSM and outputs the second PWM signal ($PWM_{FEEDBACK}$) in response to the digital output ($D_Q$).

8. The system of claim 7, wherein the multiplexer selects a timing offset in response to the digital output ($D_Q$).

9. The system of claim 7, wherein the multiplexer selects an offset ($T_O$) from a preconfigured set of offsets ($T_{-1}$, $T_0$, $T_{+2}$, $T_{+4}$) in response to the digital output ($D_Q$).

10. The system of claim 7, wherein the multiplexer selects an offset ($T_O$) from a preconfigured set of offsets ($T_w$, $T_x$, $T_y$, $T_z$) in response to the digital output ($D_Q$).

* * * * *